(12) United States Patent
Kim et al.

(10) Patent No.: US 11,765,962 B2
(45) Date of Patent: *Sep. 19, 2023

(54) STRETCHABLE DISPLAY DEVICE

(71) Applicant: LG Display Co., Ltd., Seoul (KR)

(72) Inventors: Seulki Kim, Seosan-si (KR); JiYoung Ahn, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 139 days.

This patent is subject to a terminal disclaimer.

(21) Appl. No.: 17/374,490

(22) Filed: Jul. 13, 2021

(65) Prior Publication Data
US 2021/0343955 A1 Nov. 4, 2021

Related U.S. Application Data

(63) Continuation of application No. 16/588,371, filed on Sep. 30, 2019, now Pat. No. 11,108,004.

(30) Foreign Application Priority Data

Oct. 4, 2018 (KR) .......................... 10-2018-0118474

(51) Int. Cl.
*H01L 27/12* (2006.01)
*H10K 77/10* (2023.01)
(Continued)

(52) U.S. Cl.
CPC ........ *H10K 77/111* (2023.02); *H01L 27/1248* (2013.01); *H10K 59/131* (2023.02); *H10K 2102/311* (2023.02)

(58) Field of Classification Search
CPC ............ H01L 51/0097; H01L 27/3276; H01L 27/1248; H01L 2251/5338; H01L 27/1218;
(Continued)

(56) References Cited

U.S. PATENT DOCUMENTS 9,841,548 B2 12/2017 Kim et al.
10,719,103 B2 7/2020 Chung et al.
(Continued)

FOREIGN PATENT DOCUMENTS

CN 107544172 A 1/2018
CN 107710885 A 2/2018
(Continued)

*Primary Examiner* — Karen Kusumakar
(74) *Attorney, Agent, or Firm* — Seed IP Law Group LLP

(57) ABSTRACT

A stretchable display device according to an aspect of the present disclosure includes: a first substrate including an active area, a non-active area adjacent to the active area, and a pad area extending from a side of the non-active area; a plurality of second substrates are spaced apart from each other on the first substrate; and connecting lines electrically connecting pads disposed on the second substrates adjacent to each other of the plurality of second substrates. The plurality of second substrates includes a first set disposed in the non-active area, a second set disposed in the active area and a third set disposed in the pad area. Accordingly, a stretchable display device according to an aspect of the present disclosure may stretch throughout not only the active area, but also the non-active area and the pad area.

16 Claims, 14 Drawing Sheets

(51) Int. Cl.
*H10K 59/131* (2023.01)
*H10K 102/00* (2023.01)

(58) Field of Classification Search
CPC .............. H01L 27/1244; H01L 27/3253; H01L 27/156; H01L 33/20; H01L 33/62; Y02E 10/549; G09F 9/301; G09F 9/33
See application file for complete search history.

(56) References Cited

U.S. PATENT DOCUMENTS

| | | |
|---|---|---|
| 2016/0055783 A1 | 2/2016 | Lee et al. |
| 2016/0295689 A1 | 10/2016 | Chang et al. |
| 2016/0308151 A1 | 10/2016 | Kim et al. |
| 2016/0320878 A1 | 11/2016 | Hong et al. |
| 2016/0321992 A1 | 11/2016 | Kim et al. |
| 2017/0005077 A1* | 1/2017 | Kim ................. H05K 1/0283 |
| 2017/0371376 A1 | 12/2017 | Chung et al. |
| 2018/0006004 A1 | 1/2018 | Namkung et al. |
| 2018/0145124 A1 | 5/2018 | Kim et al. |
| 2019/0109181 A1* | 4/2019 | Chung ................. H01L 22/26 |

FOREIGN PATENT DOCUMENTS

| | | |
|---|---|---|
| KR | 1020160022976 A | 3/2016 |
| KR | 1020160129174 A | 11/2016 |
| KR | 1020160130062 A | 11/2016 |
| KR | 1020180002108 A | 1/2018 |

\* cited by examiner

STRETCHABLE DISPLAY DEVICE

CROSS-REFERENCE TO RELATED APPLICATION

This application is a continuation of U.S. patent application Ser. No. 16/588,371, filed Sep. 30, 2019, which claims the priority of Korean Patent Application No. KR 10-2018-0118474, filed on Oct. 4, 2018, in the Korean Intellectual Property Office, the disclosure of which is incorporated herein by reference.

BACKGROUND

Technical Field

The present disclosure relates to a stretchable display device and, more particularly, to a stretchable display device of which not only an active area, but also a non-active area may be stretched.

Description of the Related Art

An Organic Light Emitting Display (OLED) that emits light by itself, a Liquid Crystal Display (LCD) that requires separate light sources, etc., are used as the display devices of a computer monitor, a TV, a mobile phone, and the like.

Display devices are being applied to more and more various fields including not only a computer monitor and a TV, but personal mobile devices, a display device having a wide active area and reduced volume and weight is being studied.

Further, recently, with the development of the technology related to display devices, flexible display devices that may folded or rolled have been actively studied and developed, and in addition, stretchable display devices that may be laterally or longitudinally stretched have been actively studied and developed.

BRIEF SUMMARY

An object of the present disclosure is to provide a stretchable display device having a front surface that may be stretched and contracted by configuring not only an active area, but also a non-active area adjacent to the active area to be able to stretch and contract.

Another object of the preset disclosure is to provide a stretchable display device having a bendable or foldable non-active area.

Objects of the present disclosure are not limited to the above-mentioned objects, and other objects, which are not mentioned above, can be clearly understood by those skilled in the art from the following descriptions.

The present disclosure provides a stretchable display panel and a stretchable display device that is capable of stretching laterally and/or longitudinally under force and restore to the original shape upon removing the force.

An aspect of the present disclosure is to provide a display panel comprising a first substrate including an active area, a non-active area adjacent to the active area, and a pad area extending from a side of the non-active area; a plurality of second individual substrates spaced apart from each other on the first substrate; and connecting lines electrically connecting pads disposed on the second substrates adjacent to each other of the plurality of second substrates. The plurality of second substrates includes a first set disposed in the non-active area, a second set disposed in the active area and third set disposed in the pad area.

A further aspect of the present disclosure is to provide a stretchable display panel, comprising a flexible substrate including a first area and a second area and being able to stretch and contract in a first direction and a second direction different from the first direction, a plurality of rigid substrates spaced apart from each other in the first area; and connecting lines disposed in the second area adjacent to the first area and connecting adjacent rigid substrates of the plurality of rigid substrates wherein the first area and the second area are alternately disposed in the first direction or the second direction.

The first set of plurality of second substrates that is disposed in the non-active area is organized in same rows and columns in which the second set of the plurality of second substrates disposed in the active area is disposed.

The pad area includes a first pad area where only the first substrate is disposed and a second pad area where the plurality of second substrates are disposed.

The first substrate disposed between adjacent second substrates of the plurality of second substrates disposed in the second pad area has a shape of which the width gradually decreases toward the outermost side of the substrate.

A bending line is defined between the first pad area and the second pad area, and the second pad area is bent down to the bottom surface of the first substrate along the bending line.

A dummy pixel is disposed on at least one of the plurality of second substrates disposed in the non-active area, and the at least one second substrate having the dummy pixel has different shape from the second substrates disposed in the non-active area.

The at least one second substrate having the dummy pixel of the plurality of second substrates disposed in the non-active area has a shape of two individuals, and the plurality of second substrates without the dummy pixel of the plurality of second substrates disposed in the non-active area have a shape of one individual substrate.

Different power lines are respectively disposed on the two individuals having the dummy pixel in the non-active area.

The stretchable display panel may further comprise a gate driving circuit disposed in the non-active area, wherein the gate driving circuit is configured in a Chip On Film (COF) type.

The first substrate and the second substrates have different elastic modulus and a modulus of the second substrates are higher than a modulus of the first substrate.

The connecting lines are straight in one embodiment and curved in another. They can be either curved or straight.

A Gate In Panel (GIP) type gate driving circuit is disposed on the plurality of second substrates disposed in the non-active area.

The GIP type gate driving circuit includes a plurality of stages, and the plurality of stages is disposed to correspond to rows in which the second substrates disposed in the active area.

A gate driving circuit is disposed on some rigid substrates of the plurality of rigid substrates, and the rigid substrates having the gate driving circuit are positioned in the same line in the first direction as a plurality of rigid substrates on which light emitting elements are disposed to display images.

The second area wholly surrounds each of the first area, and each of the rigid second substrates is disposed only in the first area.

A bending line that defines a bending position is positioned in the flexible substrate, and the flexible substrate is bent downward along the bending line.

An area adjacent to the bending line is composed of only the second area where the rigid substrates are not disposed.

The pad area and/or the non-active area include an area in which the second substrates are arranged have the same gaps as the second substrates in the active area. In one embodiment, the are arranged in a same line with the second substrates in the active area.

The pad area and/or the non-active area include an area in which the second substrates have an area ratio of a deviation of less than 10% from that of the second substrates in the active area.

Each of the plurality of the second substrates is surrounded laterally by a material of lower elastic modulus than that of the second substrate.

The connecting line comprises a base polymer and conductive particles, and the base polymer is disposed in a single layer on the first substrate.

The stretchable display panel further comprises flexible connecting films connected with some rigid substrates of the plurality of rigid substrates, wherein the flexible connecting films are connected with some rigid substrates disposed in a line in the first direction and some rigid substrates disposed in a line in the second direction.

A yet further aspect of the present disclosure is to provide a stretchable display device comprising a display panel as described above.

According to the present disclosure, a display panel is made of an elastic material, a stretchable display device can be easily bent or stretched.

According to the present disclosure, a plurality of relatively rigid individual substrates is spaced apart from each other with predetermined gaps on a flexible substrate, and light emitting elements and driving elements are disposed on the individual substrates. Therefore, even if a stretchable display device is stretched, breakage of the light emitting elements and the driving elements is minimized, and reliability of the stretchable display device can be improved.

According to the present disclosure, since a plurality of relatively rigid individual substrates is additionally disposed on a flexible substrate in not only an active area, but also a non-active area, the stretchable display device can be stretched throughout the entire area, so the elasticity of the stretchable display device can be further improved.

According to the present disclosure, since a rigid part and a flexible part are alternately disposed also in a non-active area to correspond to an active area where a rigid part and a flexible part are alternately disposed, the stretchable display device can be uniformly stretched throughout the area.

According to the present disclosure, since a portion of a non-active area is designed to be bendable, a stretchable display device having a narrow bezel can be achieved.

According to the present disclosure, since the portion from an area bordering on an active area of a non-active area to a bending line is composed of only a flexible substrate, the stretchable display device can be more easily bent.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
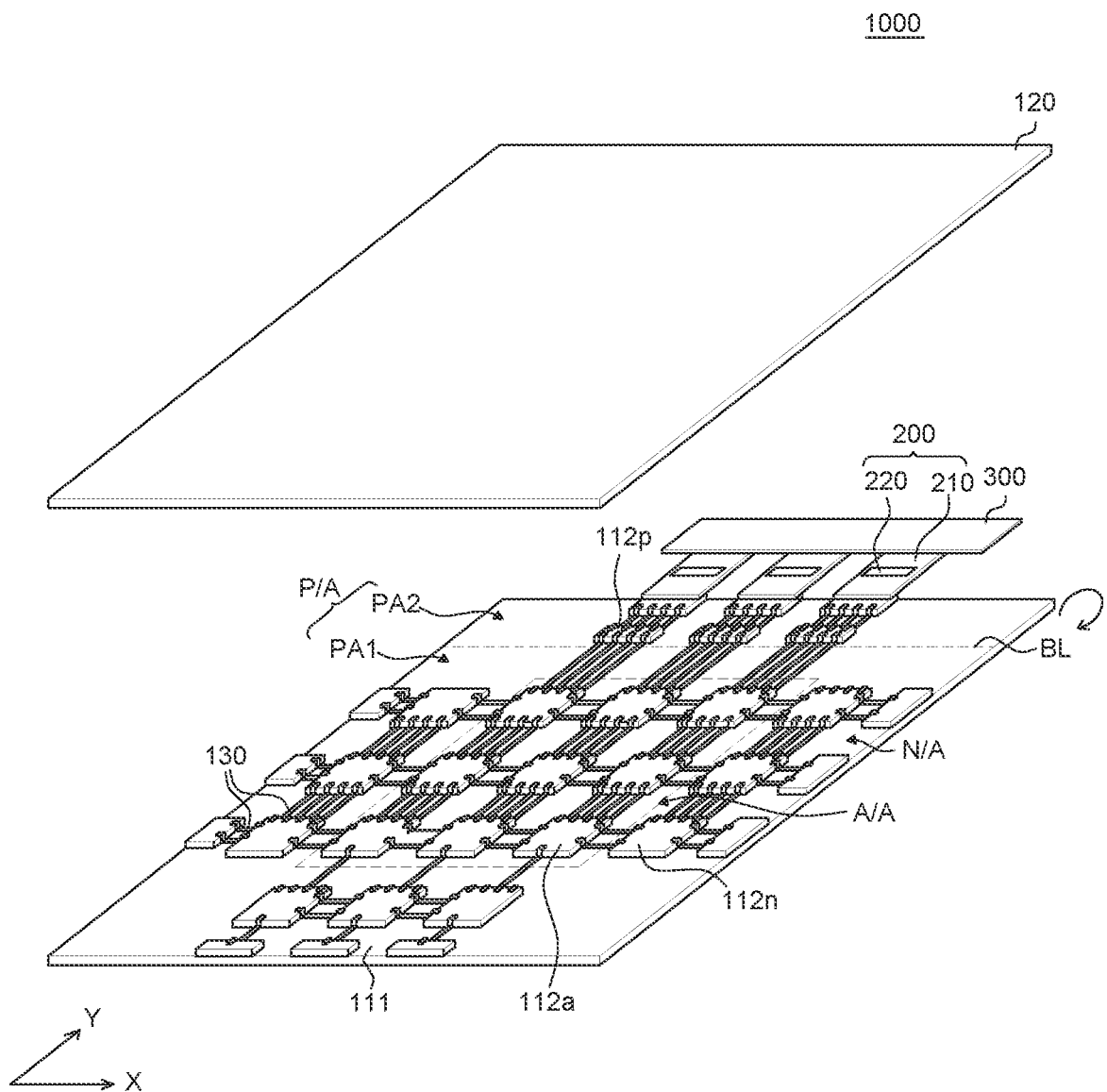
FIG. 1A is a schematic exploded perspective view showing a stretchable display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "constituting" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

In an aspect of the present disclosure, a plurality of second substrates disposed in the non-active area and the pad area is disposed to correspond to a plurality of second substrates disposed on the active area. In some embodiments, the plurality of second substrates in the non-active area and the pad area disposed to correspond to a plurality of second substrates disposed on the active area are the same or similar in size and shape and extend in a direction, and/or gap therebetween as the plurality of second substrates disposed on the active area. In some embodiments, for example, the pad area and/or the non-active area include an area in which the first and third set of the second substrates have an area ratio of a deviation of less than 10% from that of first set of the second substrates in the active area. In further embodiments, the pad area and/or the non-active area include an area in which the first and third sets of the second substrates are arranged with the same gaps as the second set of second substrates in the active area; In another embodiment, the first and third sets are arranged in a same line with the second set of the second substrates in the active area.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to exemplary embodiments of the present disclosure will be described in detail with reference to accompanying drawings.

A stretchable display device may be referred to as a display device that may display images even if it is bent or stretched. A stretchable display device may have high flexibility, as compared with common display devices. Accordingly, the shape of the stretchable display device may be freely changed in accordance with operation by the user such as bending or stretching the stretchable display device. For example, when a user holds and pulls an end of a stretchable display device, the stretchable display device may be stretched by the force of the user. Alternatively, when a user puts a stretchable display device on an uneven wall, the stretchable display device may be bent into the surface shape of the wall. When the force applied by a user is removed, a stretchable display device may return into the initial shape.

Figure 1B:
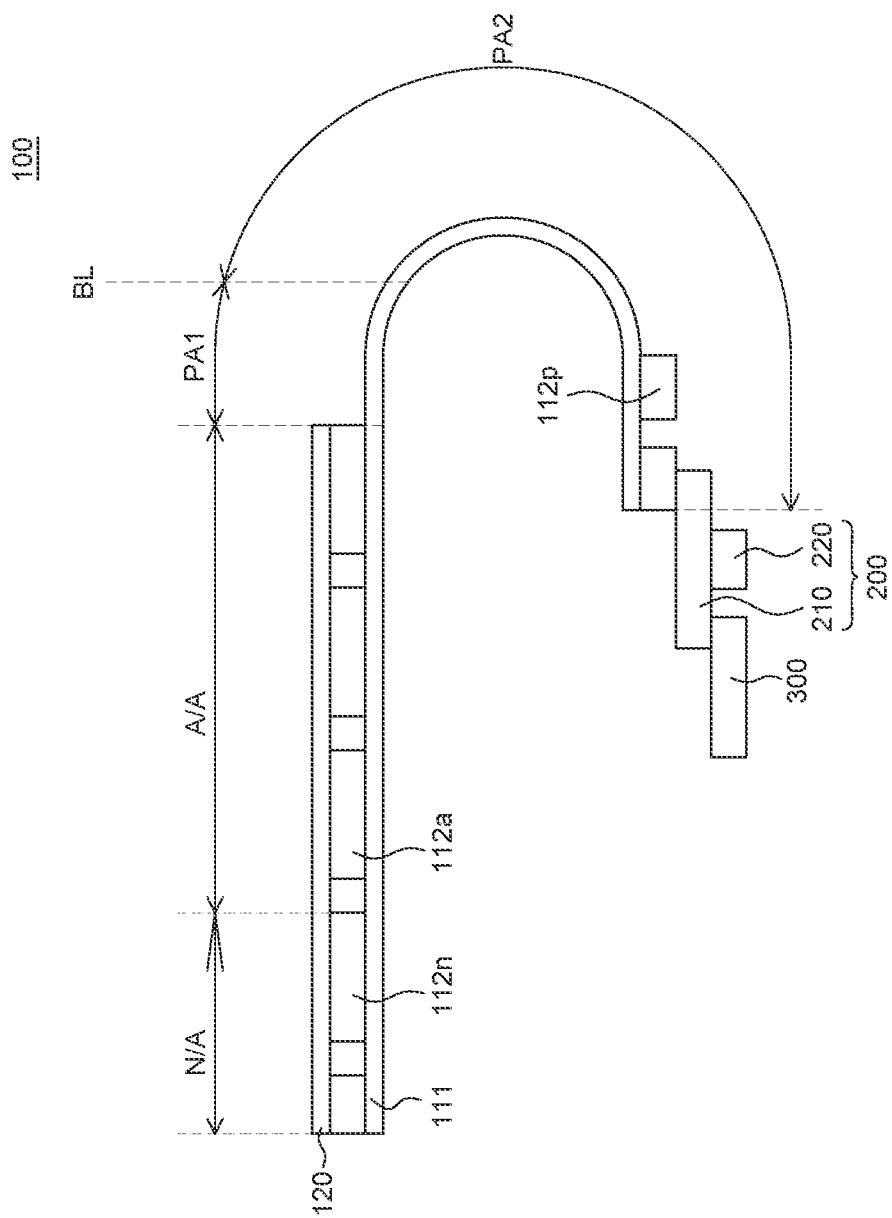
FIG. 1B is a schematic cross-sectional view when the stretchable display device according to an embodiment of the present disclosure has been bent.

FIG. 1A is a schematic exploded perspective view showing a stretchable display device according to an embodiment of the present disclosure. FIG. 1B is a schematic cross-sectional view when the stretchable display device according to an embodiment of the present disclosure has been bent.

Referring to FIGS. 1A and 1B, a stretchable display device 1000 according to an embodiment of the present disclosure includes a display panel 100, flexible connecting films 200, and a printed circuit board 300.

The display panel 100 may stretch and contract in any one of a first direction X and a second direction Y or may 2-dimensionally stretch and contract in the first direction X and the second direction Y. The first direction X and the second direction Y define the plane of the stretchable display device 1000 and the second direction Y may be perpendicular to the first direction X.

The display panel 100 includes a lower substrate 110 disposed at a lower portion and an upper substrate 120 disposed on the lower substrate 110. The lower substrate 110 and the upper substrate 120, as shown in FIGS. 1A and 1B, may have different sizes. In more detail, the lower substrate 110 may be larger in size (area) than the upper substrate 120 in the stretchable display device 1000 according to an embodiment of the present disclosure. Although the lower substrate 110 is illustrated to be larger than the upper substrate 120 in FIGS. 1A and 1B, the present disclosure is not limited thereto, and the lower substrate 110 and the upper substrate 120 may have the same size. Though not shown in FIGS. 1A and 1B, the display panel 100 may further include a polarizing plate that may be disposed under the lower substrate 110 or over the upper substrate 120.

The lower substrate 110 may include a first substrate 111 made of a pliant or flexible material that is able to bend or stretch and a second substrate 112 made of a material more rigid than the first substrate 111 and disposed on the first substrate 111.

A stretchable display device includes an easily bending or stretching characteristic, so there have been attempts to use substrates that are soft or flexible due to a small elastic modulus, sometimes referred to herein an elastic modulus and other times as just the modulus). However, when a flexible material such as Polydimethylsiloxane (PDMS) having a small modulus is used as a lower substrate that is disposed in the process of manufacturing a light emitting element, the substrate is damaged by high temperature, for example, temperature over 100° C. that is generated in the process of forming transistors and light emitting elements due to the characteristic that a material having a small modulus is weak to heat.

According to principles as taught by this disclosure, light emitting elements should be formed on a substrate made of a material that may withstand high temperature, so damage to the substrate may be prevented in the process of manufacturing the light emitting elements. Accordingly, there have been attempts to manufacture a substrate using materials that may withstand high temperature, which is generated in the manufacturing process, such as Polyimide (PI). However, materials that may withstand high temperature are not flexible due to having a large elastic modulus, so substrates are not easily bent or stretched when stretching stretchable display devices.

Therefore, a plurality of second substrates 112 that are rigid substrates are disposed only in the areas where transistors or organic light emitting elements are disposed in the stretchable display device 1000 according to an embodiment of the present disclosure, so damage to the lower substrate 110 due to high temperature in the process of manufacturing the transistors or the organic light emitting elements may be does not occur, thanks to the plurality of second substrates 112 being separately formed and placed on the pliant substrate 110.

In the stretchable display device 1000 according to an embodiment of the present disclosure, the first substrate 111 that is a flexible substrate and the upper substrate 120 may be disposed respectively under and on the second substrates 112. Accordingly, the other areas of the first substrate 111 and the upper substrate 120 excepting the areas overlapped with the second substrates 112 that are a plurality of individual substrates may be easily stretched or bent, so the stretchable display device 1000 may be achieved.

Further, it is possible to suppress damage to the transistors, the organic light emitting elements, etc., disposed on the second substrates 112 that are individual substrates that are rigid substrates when the stretchable display device 1000 is bent or stretched.

The first substrate 111 is a substrate supporting and protecting various components of the stretchable display device 1000. The first substrate 111 may be made of an insulating material that may bend or stretch and contract. For example, the first substrate 111 may be made of silicon rubber such as Polydimethylsiloxane (PDMS) or an elastomer such as Polyurethane (PU). The material of the first substrate 111, however, is not limited thereto. The first substrate 111 may have a elastic modulus that is quite low, in the range of several to hundreds of MPa and a tensile fracture rate (elongation at failure) of 100% or more. The thickness of the first substrate 111 may be 10 μm to 1 mm, but is not limited thereto. Connecting lines 130 electrically connecting the second substrates 112 are disposed on the first substrate 111.

The individual second substrates 112 are spaced apart from each other like individuals on the first substrate 111. The second substrates 112 are substrates that are more rigid than the flexible substrate 111, but are still flexible substrates with less elasticity. The second substrates 112, for example, may be made of Polyimide (PI)-based resin or epoxy-based resin. The second substrates 112 are spaced apart from each other on the first substrate 111. The modulus of the second substrates 112 may be e.g., a thousand times larger than that of the first substrate 111, but is not limited thereto.

The upper substrate 120 is a substrate overlapped with the lower substrate 110 to protect various components of the display panel 100. The upper substrate 120 may be made of a bendable or stretchable insulating material. For example, the upper substrate 120 may be made of a material having elasticity and may be made of the same material as the flexible substrate of the lower substrate 110, that is, the first substrate 111, but is not limited thereto.

The display panel 100 includes an active area A/A where images are displayed, a non-active area N/A disposed adjacent to the active area A/A and/or surrounding the active area A/A, and a pad area P/A where bonding pads and power pads bonded to the flexible connecting films 200 are disposed.

The active area A/A includes a plurality of pixels including a plurality of subpixels. The subpixels each may include a light emitting element and may be connected with various lines such as a gate line, a data line, a high-potential power line, and a low-potential power line.

A plurality of second substrates 112 may include a first set 112n that is disposed in the non-active area NA and a second set 112a that is disposed in the active area AA.

The second set of plurality of individual-shaped second substrates 112a may be disposed in the active area A/A on the first substrate 111 of the lower substrate 110. A light emitting element, a thin film transistor for driving the light emitting element, and various signal lines may be disposed on the second substrates 112a. The second substrates 112a of the lower substrate 110 are spaced apart from each other with predetermined gaps and are electrically connected by the connecting lines 130 disposed on the first substrate 111. The connecting lines 130 disposed on the first substrate 111 will be described below in more detail with reference to FIGS. 4A and 4B.

The non-active area N/A, which is an area disposed adjacent to the active area A/A and/or surrounding the active area A/A, is an area where an image is not displayed. Signal lines extending from the connecting lines to transmit signals to the pixel and a circuit, for example, a gate driving circuit, etc., may be disposed in the non-active area N/A to drive the pixels disposed in the active area A/A.

Dummy pixels may be further disposed in the non-active area N/A. The dummy pixels may have the same shape and some of the same components as the pixels disposed in the active area A/A. That is, the dummy pixels may include a switching transistor, a driving transistor, a capacitor, and a light emitting element. However, the light emitting elements included in the dummy pixel may not emit light in a light emitting period. The dummy pixels may have a different shape from the second substrates of the active pixels disposed in the active area A/A. This configuration will be described below in more detail with reference to FIG. 10.

A first set of the plurality of individual second substrates 112n may be disposed in the non-active area N/A, the same as the active area A/A, on the first substrate 111 of the lower substrate 110. The first set of the second substrates 112n disposed in the non-active area N/A may be disposed to correspond to the second set of the second substrates 112a disposed in the active area A/A. For example, if the second set of the second substrates 112a are spaced apart from each other with predetermined gaps in the first direction X in the active area A/A, the first set of the second substrates 112n in the non-active area N/A may also be spaced apart from each other with the same gaps in the first direction X. In detail, the first set of the second substrates 112n disposed in the non-active area N/A may be disposed to correspond to the column and the row of the second set of the second substrates 112a disposed in the active area A/A. As described, since the second set of second substrates 112a disposed in the active area A/A and the first set of the second substrates 112n disposed in the non-active area N/A correspond to each other, at least two or more sides of the stretchable display device 1000 may be uniformly stretched.

The lines disposed in the second substrates 112n disposed in the non-active area N/A and the lines disposed on the first substrate 111 may have the same shape or may have different shapes. For example, if the lines disposed in the second substrates 112n have a straight shape, the lines disposed in the first substrates 111 may have the same straight shape, or may have another curved shape different from the straight shape, that is, a wave shape or a diamond shape.

The pad area P/A, which is an area extending from a side of the non-active area N/A, is an area where an image is not displayed. That is, the pad area P/A is an area through which the lower substrate 110 may be exposed due to the size difference between the lower substrate 110 and the upper substrate 120 of the display panel 100. Although the pad area P/A may be exposed outside in an embodiment of the present disclosure, the pad area P/A is not limited thereto and may not be exposed outside when the lower substrate 110 and the upper substrate 120 have the same size. Lines extending from the lines disposed in the active area A/A and the non-active area N/A, power pad for supplying high-potential power or low-potential power to the display panel, bonding pads for electrical connection with the flexible connecting films 200, etc., may be disposed in the pad area P/A.

In other words, the pad area P/A is an area extending from a side in the second direction Y of the non-active area N/A to have a predetermined area. A plurality of individual-shaped second substrates 112*p* may be disposed in the pad area P/A, the same as the active area A/A, on the first substrate 111 of the lower substrate 110. The second substrates 112*p* disposed in the pad area P/A may alternatively be referred to as third substrates, but the third substrates also may have the same modulus as the second substrates 112*a* disposed in the active area A/A and the second substrates 112*n* disposed in the non-active area N/A. However, the second substrates 112*p* may not be disposed in some area of the pad area P/A to correspond to the active area A/A. The area without the second substrates 112*p* may be an area where a bending line BL may be defined. The pad area P/A may include a first pad area PA1 and a second pad area PA2.

The first pad area PA1 is an area disposed adjacent to the non-active area N/A. In more detail, the first pad area PA1 is an area disposed between the non-active area N/A and the second pad area PA2. The first pad area PA1 may be an area where only the first substrate 111 is disposed in the whole area excepting the outermost sides in the second direction Y. That is, the first pad area PA1 is an area where the second substrates 112 are not disposed to correspond to the active area A/A. As described above, since only the first substrate 111 having relatively high elongation is disposed in the first pad area PA1 in the stretchable display device 1000 according to an embodiment of the present disclosure, a portion of the pad area P/A may be easily bent.

The second pad area PA2, which is an area where bonding pads electrically connected with the flexible connecting films 200 are disposed, is disposed between the first pad area PA1 and the flexible connecting films 200. The second substrates 112*p* may be spaced apart from each other with predetermined gaps in the first direction X in the second pad area PA2. Further, the second substrates 112*p* in the second pad area PA2 may be disposed corresponding to the second substrates 112*a* disposed in the active area A/A. For example, if the second substrates 112*a* are spaced apart from each other with predetermined gaps in the first direction X in the active area A/A, the second substrates 112*p* disposed in the pad area P/A may also be spaced apart from each other with the same gaps in the first direction X.

The bending line BL may be positioned in the pad area P/A. In more detail, the bending line BL may be disposed at a boundary between the first pad area PA1 and the second pad area PA2 and may be at the end of the area where only the first substrate 111 is disposed of the first pad area PA1. Accordingly, the bending line BL may be the reference for defining the first pad area PA1 and the second pad area PA2.

The pad area P/A, as shown in FIG. 1B, is bent down to the lower substrate 110 along the bending line BL. In particular, since the first pad area PA1 is composed of only the first substrate 111 made of a flexible material in comparison to the second substrates 112, the stretchable display device 1000 according to an embodiment of the present disclosure may be more easily bent. Further, since when some area of the pad area P/A is bent down under the display panel 100, the bonding pads disposed in the pad area P/A are positioned on the bottom surface of the display panel 100, the width of the bezel of the stretchable display device 1000 according to an embodiment of the present disclosure may be reduced.

The flexible connecting films 200, which are films having various components on a base film 210 made of a flexible material, include components for supplying signals to the subpixels in the active area A/A. The flexible connecting films 200 are disposed between the display panel 100 and the printed circuit board 300 and transmit signals input from the printed circuit board 300 to the display panel 100. That is, the flexible connecting films 200 may be disposed between the display panel 100 and the printed circuit board 300 and may electrically connect the display panel 100 and the printed circuit board 300. The flexible connecting films 200 may be bonded to the second substrates 112*p* disposed with a plurality of bonding pads thereon in the pad area P/A and may supply a power voltage, a data voltage, a gate voltage, etc., to the subpixels in the active area A/A through the bonding pads.

The flexible connecting films 200 according to an embodiment of the present disclosure are disposed at a side in the second direction Y, as shown in FIG. 1A. However, the stretchable display device 1000 according to an embodiment of the present disclosure is not limited thereto and the flexible connecting films 200 may be disposed at both of a side in the first direction X and a side in the second direction Y. Accordingly, this may vary depending on the arrangement of the gate driving circuit.

In general, a gate driving circuit may be formed independently from a display panel and electrically connected with the display panel in various ways. Recently, a gate driving circuit may be mounted with pixel arrays in a display panel as a plan for reducing a bezel area, which is called a Gate In Panel (hereafter, referred to as 'GIP').

When a gate driving circuit is configured in the GIP type, as shown in FIG. 1A, the flexible connecting films 200 are disposed only at a side in the second direction Y. When a gate driving circuit is disposed independently from a display panel, the flexible connecting films 200 may be disposed not only at a side in the second direction Y, but also at a side in the first direction X. Accordingly, a driving integrated circuit disposed on the flexible connecting films 200 disposed in the first direction X of the stretchable display device 1000 according to an embodiment of the present disclosure may be a gate driving circuit and a driving integrated circuit disposed on the flexible connecting films 200 disposed in the second direction Y may be a data driving circuit. Accordingly, in the stretchable display device 1000 according to an embodiment of the present disclosure to be described below, the shape of the non-active area N/A may be different when a gate driving circuit is disposed in the GIP type and when a gate driving circuit is disposed independently from a display panel. Accordingly, the stretchable display device 1000 according to an embodiment of the present disclosure is described below for the case when a gate driving circuit is disposed in the GIP type and the case when a gate driving circuit is disposed independently from a display panel. This configuration will be described below in detail with reference to FIGS. 7 to 10.

The flexible connecting films 200 include a base film 210 and a driving integrated circuit 220 disposed on the base film 210.

The base film 210 is a layer supporting the driving integrated circuit 220. The base film 210 may be made of an insulating material having flexibility and, for example, it may be made of Polyimide (PI)-based resin or epoxy-based resin.

The driving integrated circuit 220 processes data for displaying images that are input from the outside, and driving signals for processing the data. Although the driving integrated circuit 220 is mounted in a Chip On Film (COF) type in FIGS. 1A and 1B, it is not limited thereto and may be mounted in a Chip On Glass (COG) or a Tape Carrier Package (TCP) type.

Though not shown in FIGS. 1A and 1B, the flexible connecting films 200 further include a plurality of conductive lines disposed on at least one surface of the base film 210. The conductive lines transmit image data and driving data input from the printed circuit board 300 to the driving integrated circuit 220 and transmit data signals and driving control signals output from the driving integrated circuit 220 to the display panel 100.

A controller for controlling a circuit disposed on the display panel 100 and the driving integrated circuit 220 disposed on the flexible connecting films 200 may be disposed on the printed circuit board 300. The printed circuit board 300 receives image data and driving data from the outside and outputs the data to the flexible connecting films 200. The flexible connecting film 200 converts the image data and the driving data into a data signal and a driving control signal and outputs the signals to the display panel 100. A memory, a processor, etc., also may be mounted on the printed circuit board 300.

Though not provided herein, a polarizing plate that may be included in the stretchable display device 1000 according to an embodiment of the present disclosure is a component suppressing external light reflection of the stretchable display device 1000 and may be disposed on the upper substrate 120 while overlapping the upper substrate 120. However, the polarizing plate is not limited thereto and, may be disposed under the upper substrate 120, or may not be provided, depending on the configuration of the stretchable display device 1000.

The structure of the bendable display panel 100 of the stretchable display device 1000 according to an embodiment of the present disclosure is described in more detail hereafter.

Figure 2A:
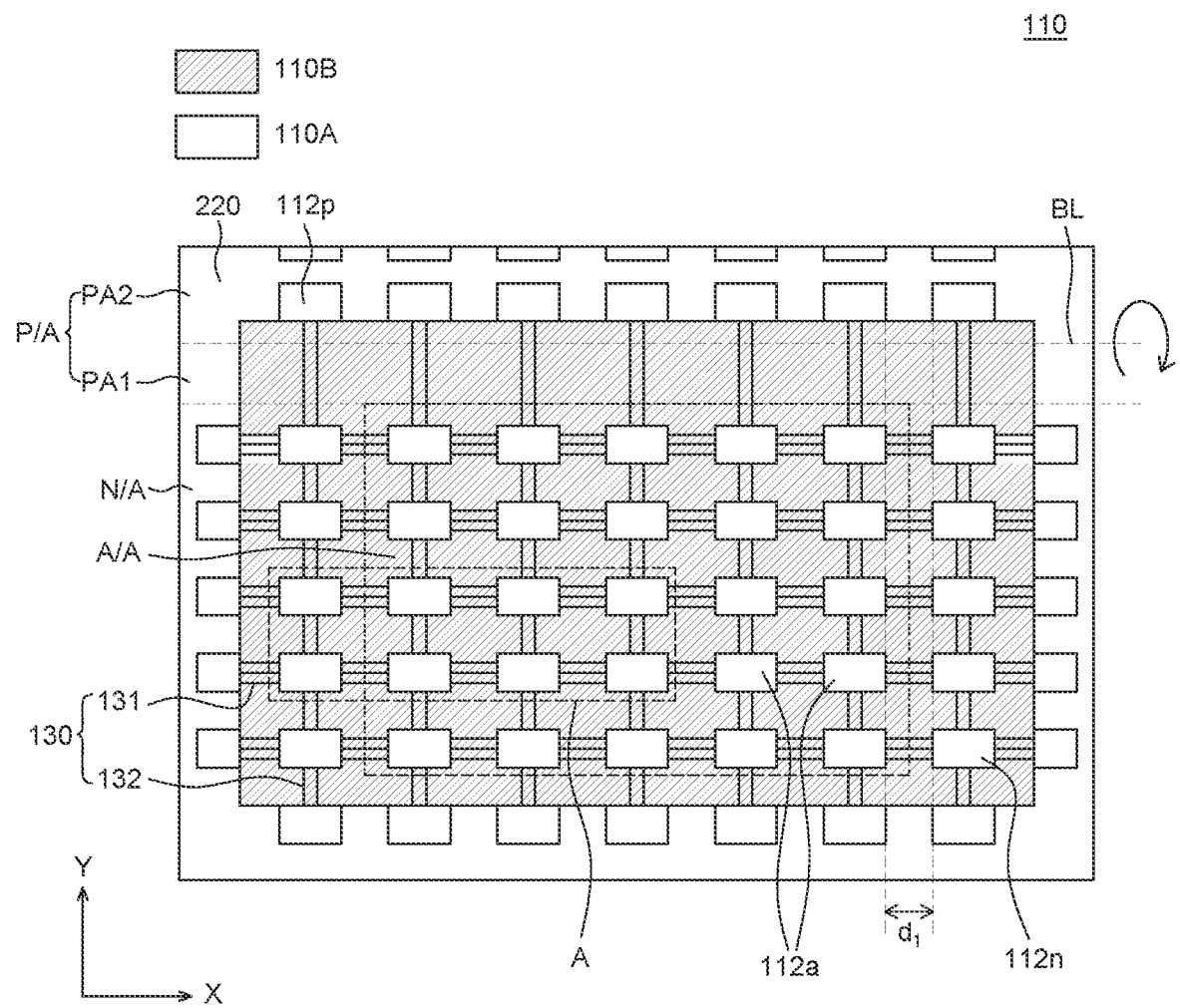
FIGS. 2A and 2B are schematic plan views of the stretchable display panel according to an embodiment of the present disclosure.
Figure 2B:
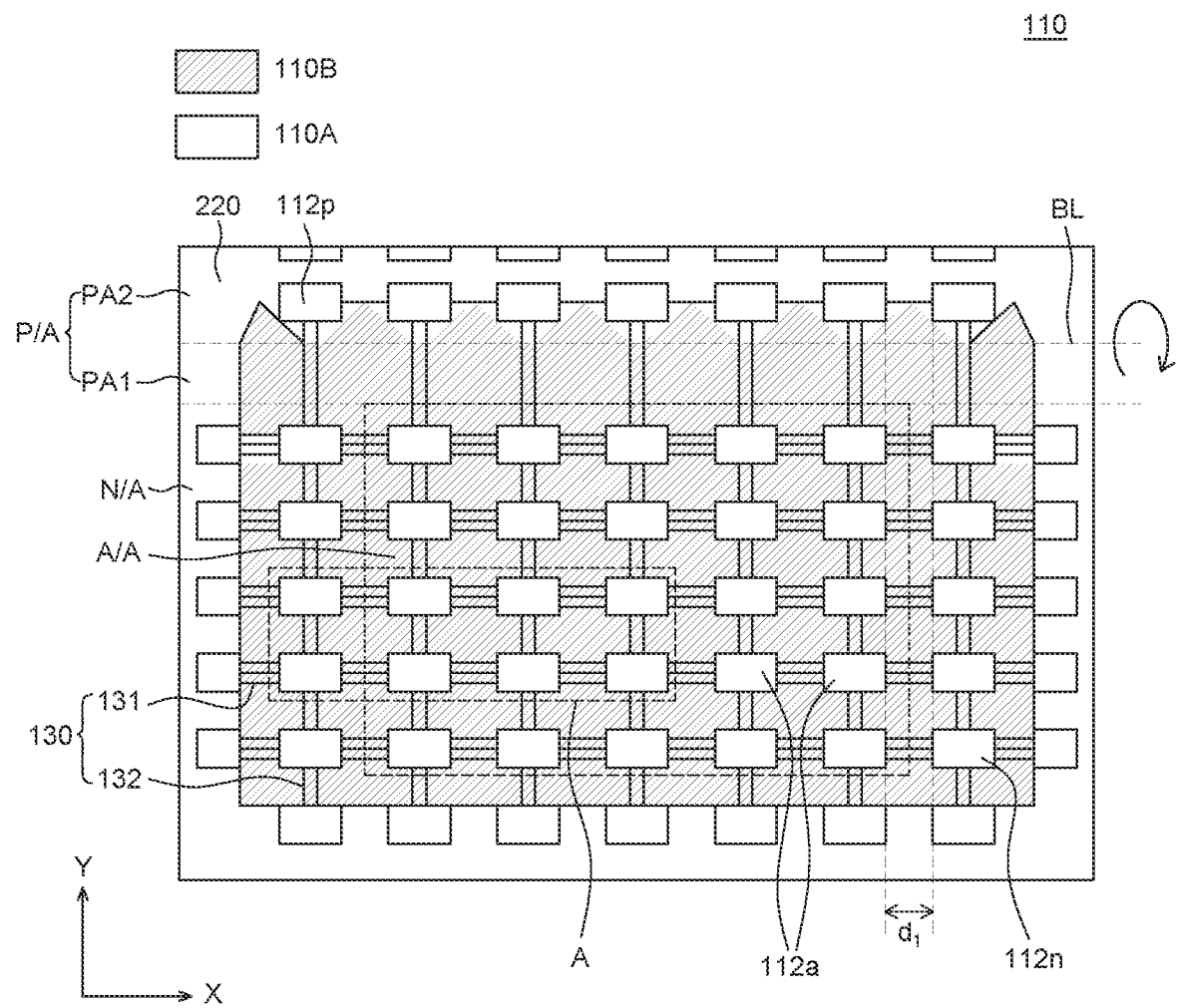
Figure 3A:
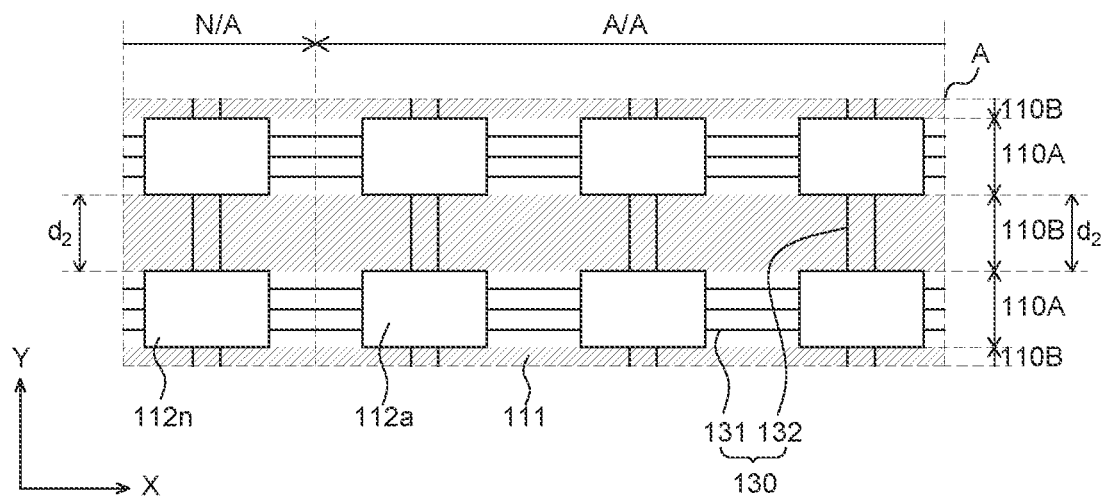
FIGS. 3A and 3B are schematic partial plan views illustrating arrangement of first areas and second areas by enlarging the area A shown in FIGS. 2A and 2B.
Figure 3B:
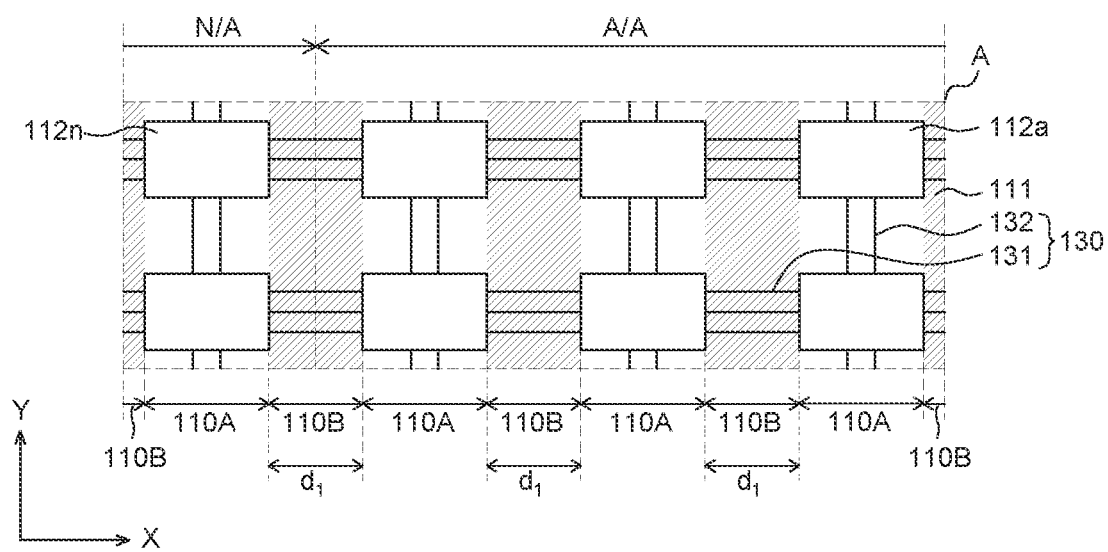

FIGS. 2A and 2B are schematic plan views of the stretchable display panel according to an embodiment of the present disclosure. FIGS. 3A and 3B are schematic partial plan views illustrating arrangement of a first area and a second area by enlarging the area A shown in FIGS. 2A and 2B.

Referring to FIGS. 2A and 2B, a first area 110A and a second area 110B having different moduli may be defined on the lower substrate 110 of the stretchable display device 1000 according to an embodiment of the present disclosure.

The first area 110A may have a larger modulus than the second area 110B. The modulus may be an elastic modulus showing the ratio of deformation of a substrate to stress applied to the substrate, and when the modulus is relatively high, the rigidity may be relatively high. Accordingly, the first area 110A may be a rigid area that is more rigid than the second area 110B. Accordingly, the second area 110B may be a highly more flexible area that is more flexible than the first area 110A. The modulus of the first area 110A may be a thousand times larger than that of the second area 110B, but is not limited thereto.

In more detail, the first area 110A is an area where the second substrates 112 made of a rigid material are disposed and the second area 110B, which is an area without the second substrates 112, may be an area where only the first substrate 111 made of a flexible material in comparison to the second substrates 112 is disposed. Accordingly, a pixel including a plurality of subpixels for displaying images may be disposed on each of the second substrates 112a disposed in the first area 110A, that is, in the active area A/A.

Referring to FIGS. 2A and 2B, driving elements for driving the subpixels SPX and signal pads may be disposed on the second substrates 112n disposed in the non-active area N/A and the second substrates 112p disposed in the pad area P/A, respectively. For example, if a gate driving circuit is disposed in a Gate In Panel (hereafter, referred to as 'GIP') type, a plurality of stages constituting the GIP may be respectively disposed on the second substrates 112n.

The connecting lines 130 are disposed between the individual-shaped second substrates 112, that is, in the second area 110B. The connecting lines 130 may electrically connect the second substrates 112 to each other. That is, the connecting lines 130 may electrically connect a second substrate 112a and one adjacent second substrate 112a disposed in the active area A/A and may electrically connect the second substrates 112a disposed in the active area A/A and the second substrates 112n disposed in the non-active area N/A. Further, the connecting lines 130 may electrically connect the second substrates 112n disposed in the non-active area N/A to each other. Further, the connecting lines 130 may electrically connect the second substrates 112n disposed in the non-active area N/A and the second substrates 112p disposed in the pad area P/A and may electrically connect second substrates 112p disposed in the pad area P/A to each other. For example, in order to electrically connect the second substrates 112a, 112n, and 112p and adjacent second substrates 112a, 112n, and 112p, pads that should be connected with the connecting lines 130 of the components of light emitting elements or driving elements disposed on the second substrates 112a, 112n, and 112p, for example, gate pads, data pads, power pads, or signal pads may be disposed on the second substrates 112a, 112n, and 112p. Further, the pads on the second substrates 112a, 112n, and 112p may be electrically connected.

The connecting lines 130 may include first connecting lines 131 and second connecting lines 132. The first connecting lines 131 are lines disposed in the first direction X on the display panel 100 and the second connecting lines 132 are lines disposed in the second direction Y on the display panel 100.

The first area 110A is an area where the second substrates 112 are disposed in the active area A/A, the non-active area N/A, and the pad area P/A, and it may be referred to as a rigid area. The second substrates 112a disposed in the active area A/A, the second substrates 112n disposed in the non-active area N/A, and the second substrates 112p disposed in the pad area P/A may be disposed to respectively correspond to each other. For example, if the second substrates 112a disposed in the first direction X in the active area A/A are disposed with a first gap d1 therebetween, the second substrates 112n disposed in the non-active area N/A and the second substrates 112p disposed in the pad area P/A also may be disposed with the first gaps d1 therebetween.

The second area 110B, which is the area between the second substrates 112, is an area where only the first substrate 111 is disposed. That is, it may be referred to as a flexible area. In other words, the connecting lines 130 may be disposed in the second area 110B.

The first area 110A and the second area 110B are alternately disposed in the first direction X, as shown in FIG. 3B. For example, the second substrates 112a disposed in the active area A/A may be disposed with a first gap d1 therebetween in the first direction X, the second substrates 112n disposed in the non-active area N/A also may be disposed, in the first direction X, with the same gap that is the first gap d1 from the second substrates 112a disposed at the outermost side of the active area A/A. The second substrates 112a and 112n disposed in the active area A/A and the non-active area N/A may be aligned in the same columns and the corresponding area may be the first area 110A that is a rigid area. The connecting lines 130 electrically connecting the second substrates 112a are disposed in the area between the second substrates 112a in the active area A/A and the area between the second substrates 112a at the outermost side in the active area A/A and the second substrates 112n disposed in the non-active area N/A. The area where the connecting lines 130 are disposed in the first direction X, in more detail, the first connecting lines 131 are disposed may be the second area 110B that is a flexible area. Accordingly, as shown in FIG. 3A, the area that is the column in which the second substrates 112a and 112n are disposed may be the first area 110A and the area where the connecting lines 130 connecting the second substrates 112a and 112n are disposed may be the second area 110B. That is, the first area 110A that is a rigid area and the second area 110B that is a flexible area of the stretchable display panel 100 according to an embodiment of the present disclosure may be alternately disposed in the first direction X.

The first area 110A and the second area 110B are alternately disposed in the second direction Y, as shown in FIG. 3A. For example, the second substrates 112a disposed in the active area A/A may be disposed with a second gap d2 therebetween in the second direction Y, the second substrates 112n disposed in the non-active area N/A also may be disposed with the same gap that is the second gap d2 therebetween in the second direction Y. The second substrates 112a and 112n disposed in the active area A/A and the non-active area N/A may be aligned in the same rows and the corresponding area may be the first area 110A that is a rigid area. The connecting lines 130 electrically connecting the second substrates 112a are disposed in the area between the second substrates 112a in the active area A/A and the area between the second substrates 112n disposed in the non-active area N/A. The area where the connecting lines 130 are disposed in the second direction Y, in more detail, the second connecting lines 132 are disposed may be the second area 110B that is a flexible area. Accordingly, as shown in FIG. 3B, the area that is the row in which the second substrates 112a and 112n are disposed may be the first area 110A and the area where the connecting lines 130 connecting the second substrates 112a and 112n, that is, the second connecting lines 132 are disposed may be the second area 110B. That is, the first area 110A that is a rigid area and the second area 110B that is a flexible area of the stretchable display panel 100 according to an embodiment of the present disclosure may be alternately disposed in the second direction Y.

Accordingly, as shown in FIGS. 2A and 2B, there is a crossing area between the second area 110B in the first direction X and the second area 110B in the second direction. Thus, the first area 110A may be the area where the second substrates 112 are disposed.

Referring to FIGS. 2A and 2B, the second area 110B is disposed to have a larger area than the first area 110A in the first pad area PA1 of the pad area P/A. The end of the second area 110B may be the reference for defining the bending line BL in the pad area P/A.

Though not clearly shown in the figures, the second substrates 112 may be disposed on the first substrate 111 in the outermost area of the stretchable display panel 100. Bonding is required for electrical connection with the flexible connecting films 200. Bonding is usually performed at a high temperature. However, when only the first substrate 111 made of an elastic and flexible material is disposed, the first substrate 111 may be damaged without withstanding high temperature. Accordingly, since the outermost area of the display panel 100 is an area where a lot of bonding pads are disposed, the second substrates 112 may be further disposed on the top surface and/or the bottom surface of the first substrate 111. Accordingly, the stretchable display panel 100 according to an embodiment of the present disclosure may be stably electrically connected with the flexible connecting films 200.

As described above, since the second substrates 112 should be further disposed by bonding in the outermost area of the stretchable display panel 100, the first substrate 111 disposed between the second substrates 112p disposed in the outermost area of the second pad area PA2 may be disposed by the space between the second substrates 112p, for example, in a rectangular shape, as in FIG. 2A.

Further, as shown in FIG. 2B, the first substrate 111 disposed between the second substrates 112p disposed in the outermost area may have a shape of which the width gradually decreases toward the outermost area of the display panel 100.

As described above, the first substrate 111 that is a flexible substrate may be deformed because bonding with the flexible connecting films 200 is performed at a high temperature, so the lines, etc., disposed on the first substrate 111 may be damaged. When the first substrate 111 has a shape of which the width gradually decreases toward the outermost side of the display panel 100, the problems associated with the deformation and damage is alleviated. When the width decreases toward the outermost side, this shape may be less influenced by the heat in bonding, so the reliability of the stretchable display device may be further improved.

The detailed structure of the configuration disposed in the display panel 100 according to an embodiment of the present disclosure, that is, in the active area A/A is described hereafter.

Figure 4A:
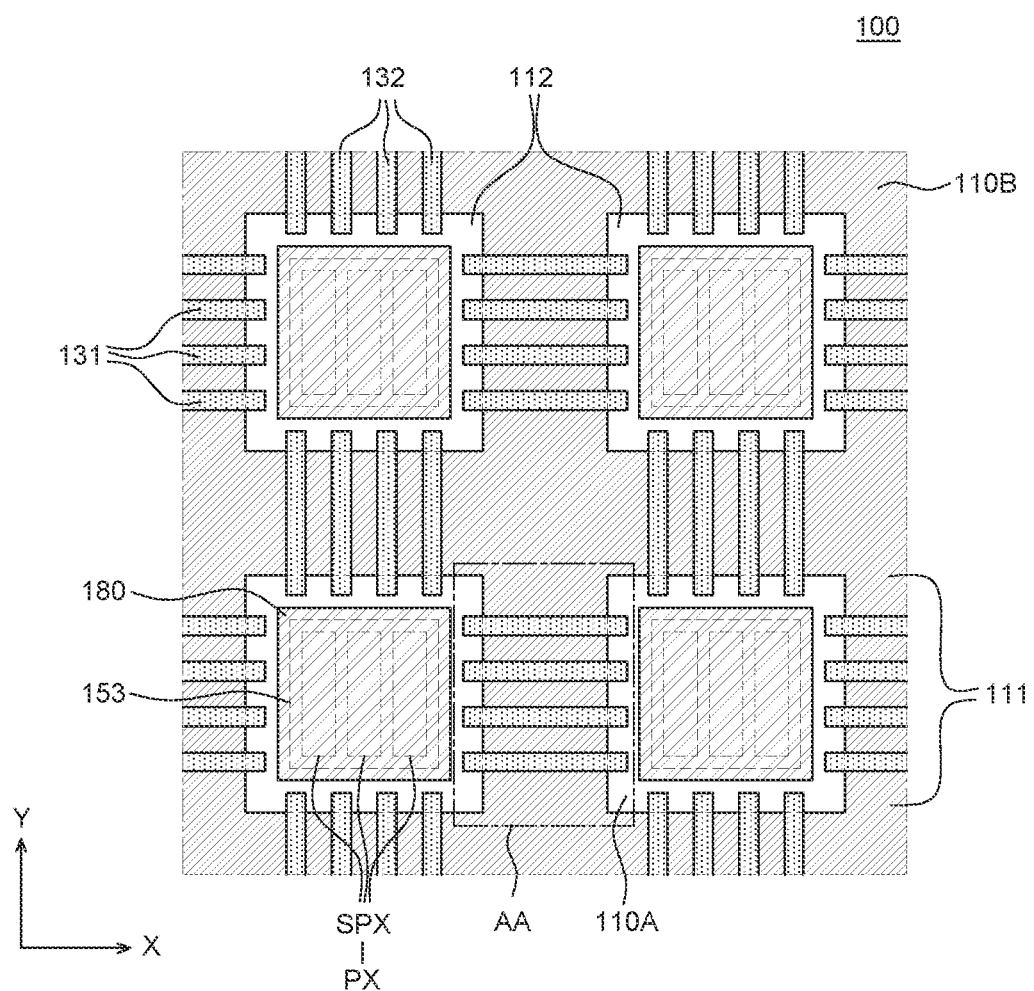
FIG. 4A is an enlarged plan view illustrating a pixel structure disposed in an active area of a stretchable display device according to an embodiment of the present disclosure.
Figure 4B:
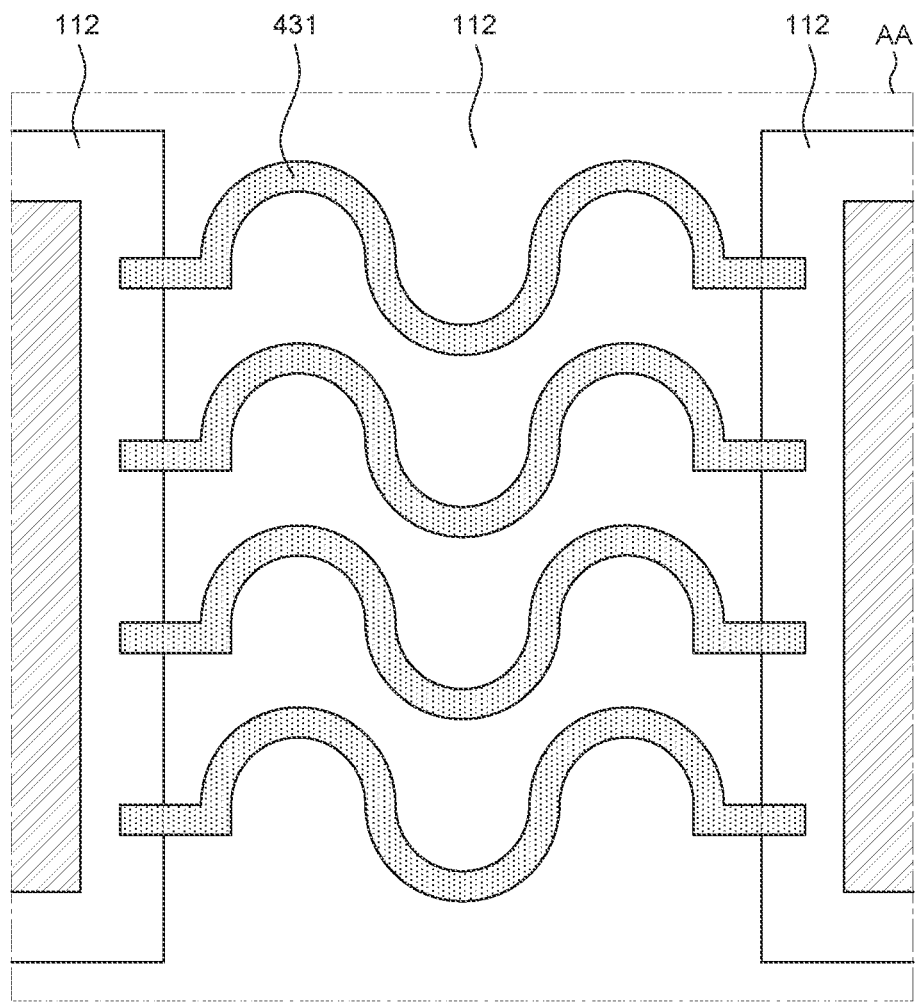
FIG. 4B is an enlarged plan view showing another embodiment of the area AA shown in FIG. 4A.

FIG. 4A is an enlarged plan view illustrating a pixel structure disposed in an active area of a stretchable display device according to an embodiment of the present disclosure. FIG. 4B is an enlarged plan view showing another embodiment of the area AA shown in FIG. 4A.

Referring to FIG. 4A, the lower substrate 110 of the stretchable display device 1000 according to an embodiment of the present disclosure may include a first substrate 111, a plurality of second substrates 112, and connecting lines 130. The first substrate 111 and the second substrates 112 or the first area 110A and the second area 110B were described above with reference to FIGS. 1A to 2B, so the connecting lines are mainly described with reference to FIG. 4A.

The connecting lines 130 are disposed between the second substrates 112, that is, in the second area 110B. The connecting lines 130 may be disposed between the pads disposed on the second substrates 112 and may electrically connect the pads. That is, a connecting line 130 electrically connects the pads on two adjacent individual substrates, that is, second substrates 112. Accordingly, the stretchable display device 1000 according to an embodiment of the present disclosure includes a plurality of connecting lines 130 to electrically connect various lines such as gate lines, data lines, high-potential power lines, and reference voltage lines between the second substrates 112. For example, a gate line may be disposed on the second substrates 112 disposed adjacent to each other in the first direction X and gate pads may be disposed at both ends of the gate line. The gate pads on the second substrates 112 disposed adjacent to each other in the first direction X may be connected to each other by a connecting line 130 functioning as a gate line. Accordingly, the gate lines disposed on the second substrates 112 and the connecting line 130 disposed on the first substrate 111 may function as one gate line. All various lines that may be included in the stretchable display device 1000, such as the data lines, high-potential power lines, and reference voltage lines, also each may function as one line as a connection line 130, as described above.

The connecting lines 130 may include first connecting lines 131 and second connecting lines 132.

The first connecting lines 131 are lines disposed in the first direction X on the display panel 100 and the second connecting lines 132 are lines disposed in the second direction Y on the display panel 100. The first connecting line 131 may connect pads on two substrates 112 disposed in parallel of the pads on the second substrates 112 disposed adjacent to each other in the first direction X. The first connecting line 131 may function as a gate line, a high-potential power line, or a low-potential power line, but is not limited thereto.

The second connecting line 132 may connect pads on two substrates 112 disposed in parallel of the pads on the second substrates 112 disposed adjacent to each other in the second direction Y. The second connecting line 132 may function as a data line or a reference voltage line, but is not limited thereto.

Referring to FIG. 4A, the connecting line 130 includes a base polymer and conductive particles. In detail, the first connecting line 131 includes a base polymer and conductive particles and the second line 132 includes a base polymer and conductive particles. The base polymers of the first connecting line 131 and the second connecting line 132 may be made of a bendable or stretchable insulating material similar to the first substrate 111. The base polymer, for example, may include silicon rubber such as Polydimethylsiloxane (PDMS), an elastomer such as polyurethane (PU), Styrene Butadiene Styrene (SBS), etc., but is not limited thereto. Accordingly, when the stretchable display device 1000 is bent or stretched, the base polymer may not be damaged. The base polymer may be formed by coating a material for the base polymer or applying the material using a slit to the top surface of the first substrate 111 and the top surface of the second substrates 112.

The conductive particles of the first connecting line 131 and the second connecting line 132 may be distributed by the base polymer. In detail, the first connecting line 131 and the second connecting line 132 may include conductive particles distributed with predetermined density in the base polymers. The first connecting line 131 and the second connecting line 132, for example, may be formed by uniformly dispersing conductive particles in a base polymer and then coating or hardening the base polymer with the conductive particles distributed therein onto the top surface of the first substrate 111, the bottom surface of the second substrates 112, and the bottom surface of an adhesive layer, but is not limited thereto. The conductive particles may include at least one of silver (Ag), gold (Au), and carbon, but is not limited thereto.

The conductive particles distributed in the base polymers of the first connecting line 131 and the second connecting line 132 may form a conductive path electrically connecting gate pads disposed on adjacent second substrates 112. Further, the conductive particles distributed in the base polymers of the first connecting line 131 and the second connecting line 132 may form a conductive path electrically connecting gate pads or data pads disposed on outermost individual substrates of the second substrates 112, that is, on the second substrates 112 and pads disposed in the non-active area N/A.

When the stretchable display device 1000 is bent or stretched, the first substrate 111 that is a flexible substrate may be deformed but the second substrates 112 that are individual substrates that are rigid substrates having organic light emitting elements thereon may not be deformed. In this case, if the lines connecting the pads disposed on the individual substrates are not made of an easily bendable or stretchable material, the lines may be damaged, such as cracking, due to deformation of the lower substrate.

However, in the stretchable display device 1000 according to an embodiment of the present disclosure, it is possible to electrically connect the pads disposed on the second substrates 112, using the connecting lines 130 including a base polymer and conductive particles. The base polymer is flexible to be able to easily deform. Accordingly, according to the stretchable display device 1000 of an embodiment of the present disclosure, even though the stretchable display device 1000 is deformed such as bending or stretching, the areas between the second substrates 112 are easily deformed by the connecting lines 130 including the base polymer.

Further, according to the stretchable display device 1000 of an embodiment of the present disclosure, since the connecting lines 130 include conductive particles, the conductive paths composed of the conductive particles may not be damaged such as cracking even by deformation of the base polymer. For example, when the stretchable display device 1000 is deformed such as bending or stretching, the first substrate 111 that is a flexible substrate may be deformed in the other areas excepting the areas where the second substrates 112 that are rigid substrates are disposed. The distance between the conductive particles disposed on the deforming first substrate 111 may be changed. The density of the conductive particles disposed at the upper portion of the base polymers and forming the conductive paths may be maintained at a high level to be able to transmit electrical signals even though the distance between the conductive particles is increased. Accordingly, even if the base polymers are bent or stretched, the conductive paths formed by the conductive particles may smoothly transmit electrical signals. Further, even though the stretchable display device 1000 is deformed such as bending or stretching, electrical signals may be transmitted between the pads.

Referring to FIG. 4A, the base polymers and the conductive particles distributed in the base polymers of the first connecting line 131 and the second connecting line 132 may connect straight the gate pads disposed on adjacent second substrates 112. Accordingly, since the connecting lines 130 include a base polymer and conductive particles, the connecting lines 130 connecting the pads disposed on adjacent second substrates 112 may be disposed straight to have a minimum length. That is, the stretchable display device 1000 may be achieved even if the connecting lines 130 are not curved. To this end, base polymers may be formed in a straight shape connecting the second substrates 112 in the manufacturing process. Accordingly, the conductive paths formed by the conductive particles distributed in the base polymers also may be straight. However, the shape and the process of forming the base polymers and the conductive particles of the first connecting line 131 and the second connecting line 132 may not be limited thereto. Therefore, in the stretchable display device 1000 according to an embodiment of the present disclosure, it is possible to minimize the space occupied by the connecting lines 130.

In some embodiments, the base polymer of the connecting line 130 may be formed as a single layer between adjacent second substrates 112 on the first substrate 111. In detail, a base polymer, unlike FIG. 4A, may be disposed as a single layer between second substrates 112, which are most adjacent to each other in the first direction X, in contact with the first substrate 111. A base polymer may be formed to overlap all of a plurality of pads disposed in parallel at a side on one second substrate 112. Conductive particles may be separately formed to form a plurality of conductive paths on a base polymer, which is one layer, and respectively correspond to a plurality of pads. Accordingly, conductive paths formed by conductive particles may connect straight the pads disposed on adjacent second substrates 112. For example, conductive particles may be injected to form four conductive paths on a base polymer disposed as one layer between a plurality of second substrates 112.

In some embodiments, the base polymers of the connecting lines 130 may be disposed in the entire area of the first substrate 111. That is, the base polymers may be disposed in a single layer on the first substrate 111. Conductive particles may form a conductive path connecting the pads on a plurality of adjacent second substrates 112 on the base polymer.

When the base polymers are disposed in a single layer in the entire area on the first substrate 111, there may be no separate process for patterning the base polymers. Accordingly, the process of manufacturing the base polymers and the connecting lines may be simplified, and the manufacturing costs and time may be reduced.

Since the base polymers are disposed in a single layer in the entire area on the first substrate 111, the base polymers may more efficiently distribute the force that is applied when the stretchable display device 1000 is bent or stretched.

The connecting lines 130 are straight in FIG. 4A, but they are not limited thereto and may have a wave shape, as shown in FIG. 4B, to suppress damage to the connecting lines 130 when the display panel 100 is stretched.

Referring to FIG. 4B, connecting lines 431 of a stretchable display device according to an embodiment of the present disclosure has a curved shape, that is, a wave shape. The connecting lines 431 electrically connect the pads disposed on adjacent second substrates 112 of a plurality of second substrates 112 and extend not in a straight line, but in a wave shape between the pads. For example, as shown in FIG. 4B, the connecting lines 431 may have a sine waveform. However, the connecting lines 431 are not limited to this shape and may have various shapes. For example, the connecting lines 431 may extend in a zigzag shape or a plurality of diamond-shaped connecting lines extend with the apexes connected.

The connecting lines 431 having a curved shape may be made of a different material from that shown in FIG. 4A. That is, the connecting lines 431 having a curved shape may be made of metal that is the same as the material of the gate lines or the data lines formed on the second substrates 112.

Accordingly, the connecting lines 130 include a base polymer including conductive particles that may suppress cracking in the connecting lines 130 when the connecting lines 130 are straight or the connecting lines 130 are curved when they are made of metal. Therefore, it is possible to minimize disconnection due to cracks in the lines even though the stretchable display device 1000 according to an embodiment of the present disclosure is stretched.

The structure of the subpixels SPX in the stretchable display device 1000 according to an embodiment of the present disclosure is described in detail hereafter.

Figure 5:
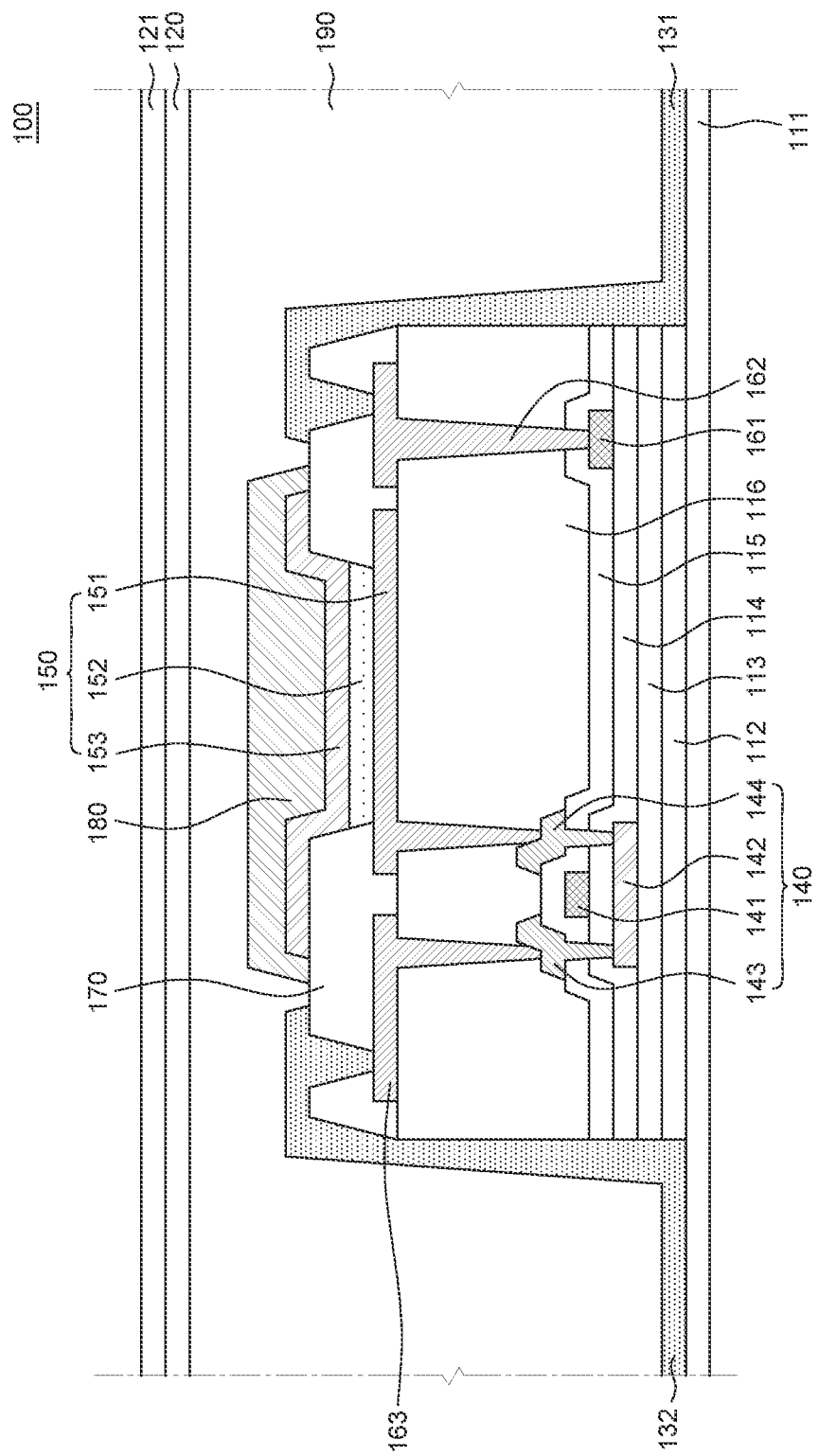
FIG. 5 is a schematic cross-sectional view of one subpixel according to an embodiment of FIG. 4A.

FIG. 5 is a schematic cross-sectional view of one subpixel according to an embodiment of FIG. 4A.

Referring to FIG. 5, a buffer layer 113 is disposed on a plurality of second substrates 112 according to one embodiment. The buffer layer 113 is disposed on the second substrates 112 to protect various components of the stretchable display device 1000 against permeation of moisture, oxygen, etc., from the outside. The buffer layer 113 may be made of an insulating material, and for example, may be a single inorganic layer or a multi-inorganic layer made of graphite, a silicon nitride, a silicon oxide (SiOx), or silicon oxynitride (SiON). However, the buffer layer 113 may not be provided, depending on the structure or characteristics of the stretchable display device 1000.

The buffer layer 113 may be formed only in the areas overlapped with the second substrates 112. As described above, since the buffer layers 113 may be made of an inorganic material, they may be easily damaged, such as cracking, when the stretchable display device 1000 is stretched. Accordingly, the buffer layer 113 is patterned similarly to the shape of the second substrates 112 without being formed in the areas between the second substrates 112, whereby it may be formed only on the second substrates 112. Therefore, since the buffer layer 113 is formed only in the areas overlapped with the second substrates 112 that are rigid substrates, it is possible to suppress damage to the buffer layer 113 even though the stretchable display device 1000 according to an embodiment of the present disclosure is deformed, such as, bending or stretching.

Referring to FIG. 5, a transistor 140 including a gate electrode 141, an active layer 142, a source electrode 143, and a drain electrode 144 is formed on the buffer layer 113. For example, as for the process of forming the transistor 140, the active layer 142 is formed on the buffer layer 113, and a gate insulating layer 114 for insulating the active layer 142 and the gate electrode 141 from each other is formed on the active layer 142. An inter-layer insulating layer 115 is formed to insulate the gate electrode 141, the source electrode 143, and the drain electrode 144 from each other, and the source electrode 143 and the drain electrode 144 that are in contact with the active layer 142 are formed on the inter-layer insulating layer 115.

The gate insulating layer 114 and the inter-layer insulating layer 115 may be formed only in the areas overlapped with the second substrates 112 by patterning. The gate insulating layer 114 and the inter-layer insulating layer 115 may also be made of an inorganic material, similar to the buffer layer 113, so they may be easily damaged such as cracking when the stretchable display device 1000 is stretched. Accordingly, the gate insulating layer 114 and the inter-layer insulating layer 115 are patterned similarly to the shape of the second substrates 112 without being formed in the areas between the second substrates 112, that is, the second area 110B, whereby they may be formed only on the second substrates 112.

Only a driving transistor of various transistors that may be included in the stretchable display device 1000 is shown in FIG. 5 for the convenience of description, but a switching transistor, a capacitor, etc., may be included in the display device. Further, although the transistor 140 is described as having a coplanar structure in the present disclosure, it is not limited thereto, various transistors, for example, having a staggered structure may be used.

Referring to FIG. 5, a gate pad 161 is disposed on the gate insulating layer 114. The gate pad 161 is a pad for transmitting a gate signal to a plurality of subpixels SPX. The gate pad 161 may be made of the same material as the gate electrode 141, but is not limited thereto.

Referring to FIG. 5, a planarization layer 116 is formed on the transistor 140 and the inter-layer insulating layer 115. The planarization layer 116 planarizes the top of the transistor 140. The planarization layer 116 may be composed of a single layer or a plurality of layers and may be made of an organic material. For example, the planarization layer 116 may be made of an acrylic-based organic material, but is not limited thereto. The planarization layer 116 may have a contact hole for electrically connecting the transistor 140 and an anode 151, a contact hole for electrically connecting a data pad 163 and the source electrode 143, and a contact hole for electrically connecting a connecting pad 162 and a gate pad 161.

In some embodiments, a passivation layer may be formed between the transistor 140 and the planarization layer 116. That is, a passivation layer covering the transistor 140 may be formed to protect the transistor 140 from permeation of moisture and oxygen. The passivation layer may be made of an inorganic material and may be composed of a single layer or a plurality of layers, but is not limited thereto.

Referring to FIG. 5, the data pad 163, the connecting pad 162, and an organic light emitting element 150 are disposed on the planarization layer 116.

The data pad 163 may transmit a data signal from a connecting line 130, which functions as a data line, to a plurality of subpixels SPX. The data pad 163 is connected with the source electrode 143 of the transistor 140 through a contact hole formed at the planarization layer 116. The data pad 163 may be made of the same material as the anode 151 of the organic light emitting element 150, but is not limited thereto. The data pad 163 may be made of the same material as the source electrode 143 and the drain electrode 144 of the transistor 140, which are formed not on the planarization layer 116, but on the inter-layer insulating layer 115.

The connecting pad 162 may transmit a gate signal from a connecting line 130, which functions as a gate line, to a plurality of subpixels SPX. The connecting pad 162 is connected with the gate pad 161 through contact holes formed at the planarization layer 116 and the inter-layer insulating layer 115 and transmits a gate signal to the gate pad 161. The connecting pad 162 may be made of the same material as the data pad 163, but is not limited thereto.

The organic light emitting elements 150 are components disposed to correspond to a plurality of subpixel SPX, respectively, and emit light having a specific wavelength band. That is, the organic light emitting element 150 may be a blue organic light emitting element that emits blue light, a red organic light emitting element that emits red light, a green organic light emitting element that emits green light, or a white organic light emitting element that emits white light, but is not limited thereto. When the organic light emitting element 150 is a white organic light emitting element, the stretchable display device 1000 may further include a color filter.

The organic light emitting element 150 includes an anode 151, an organic light emitting layer 152, and a cathode 153. In detail, the anode 151 is disposed on the planarization layer 116. The anode 151 is an electrode for supplying holes to the organic light emitting layer 152. The anode 151 may be made of a transparent conductive material with a high work function. The transparent conductive material may include an Indium Tin Oxide (ITO), an Indium Zinc Oxide (IZO), or an Indium Tin Zinc Oxide (ITZO). The anode 151 may be made of the same material as the data pad 163 and the gate pad 161 disposed on the planarization layer 116, but is not limited thereto. When the stretchable display device 1000 is implemented in a top emission type, the anode 151 may further include a reflective plate.

The anodes 151 are spaced apart from each other respectively for subpixels SPX and electrically connected with the transistor 140 through contact holes of the planarization layer 116. For example, although the anode 151 is electrically connected with the drain electrode 144 of the transistor 140 in FIG. 5, it may alternatively be electrically connected with the source electrode 143.

A bank 170 is formed on the anode 151, the data pad 163, the connecting pad 162, and the planarization layer 116. The bank 170 is a component separating adjacent subpixels SPX. The bank 170 is disposed to cover at least partially both sides of adjacent anodes 151, thereby partially exposing the top surfaces of the anode 151. The bank 170 may suppress the problem that an unexpected subpixel SPX emits light or colors are mixed by light emitted in the lateral direction of the anode 151 due to concentration of a current on the edge of the anode 151. The bank 170 may be made of acrylic-based resin, Benzocyclobutene (BCB)-based resin, or polyimide, but is not limited thereto.

The bank 170 has a contact hole for connecting a connecting line 130 functioning as a data line and a data pad 163 and a contact hole for connecting a connecting line 130 functioning as a gate line and the connecting pad 162.

The organic light emitting layer 152 is disposed on the anode 151. The organic light emitting layer 152 emits light. The organic light emitting layer 152 may include a luminescent material, and the luminescent material may include a phosphorous material or a fluorescent material, but is not limited thereto.

The organic light emitting layer 152 may be composed of one light emitting layer. Alternatively, the organic light emitting layer 152 may have a stacked structure in which a plurality of light emitting layers is stacked with charge generation layers therebetween. The organic light emitting layer 152 may further include at least one organic layer of a hole transporting layer, an electron transporting layer, a hole blocking layer, an electron blocking layer, a hole injection layer, and an electron injection layer.

Referring to FIG. 5, the cathode 153 is disposed on the organic light emitting layer 152. The cathode 153 supplies electrons to the organic light emitting layer 152. The cathode 153 may be made of Indium Tin Oxide (ITO)-based, Indium Zin Oxide (IZO)-based, Indium Tin Zinc Oxide (ITZO)-based, Zinc Oxide (ZnO)-based, or Tin Oxide (TO)-based transparent conductive oxides. Alternatively, the cathode 153 may be made of metal, e.g., a Ytterbium (Yb) alloy.

The cathodes 153 may be patterned to respectively overlap the second substrates 112. That is, the cathodes 153 may be disposed not in the areas between the second substrates 112, but only in the areas overlapped with the second substrates 112. Since the cathodes 153 are made of a transparent conductive oxide or metal, when the cathodes 153 are formed even in the areas between the second substrates 112, the cathodes 153 may be damaged when the stretchable display device 1000 is stretched/contracted. Accordingly, the cathodes 153 may be formed to respectively correspond to the second substrates 112 on a plane. The cathodes 153 may be formed to have an area not overlapped with the areas where the connecting lines 130 are formed of the areas overlapped with the second substrates 112.

Unlike common organic light emitting display devices, the cathodes 153 are patterned to correspond to the second substrates 112 in the stretchable display device 1000 according to an embodiment of the present disclosure. Accordingly, the cathodes 153 disposed on the second substrates 112 may be independently supplied with low-potential power through the connection lines 130.

Referring to FIG. 5, an encapsulation layer 180 is disposed on the organic light emitting element 150. The encapsulation layer 180 may seal the organic light emitting element 150 by covering the organic light emitting element 150 in contact with a portion of the top surface of the bank 170. Accordingly, the encapsulation layer 180 protects the organic light emitting element 150 from moisture, air, or physical shock that may be applied from the outside.

The encapsulation layers 180 respectively cover the cathodes 153 patterned to respectively overlap the second substrates 112 and may be formed on the second substrates 112, respectively. That is, the encapsulation layers 180 are disposed to each cover one cathode 153 on one second substrate 112 and the encapsulation layers 180 disposed on the second substrates 112 may be spaced apart from each other.

The encapsulation layer 180 may be formed only in the areas overlapped with the second substrates 112. As described above, since the encapsulation layers 180 may include an inorganic layer, they may be easily damaged, such as cracking, when the stretchable display device 1000 is stretched. In particular, since the organic light emitting element 150 is vulnerable to water or oxygen, when the encapsulation layer 180 is damaged, reliability of the organic light emitting element 150 may be reduced. Therefore, since the encapsulation layer 180 is not formed in the areas between the second substrates 112, damage to the encapsulation layer 180 may be minimized even though the stretchable display device 1000 according to an embodiment of the present disclosure is deformed, such as, bending or stretching.

Compared with common flexible organic light emitting display devices of the related art, the stretchable display device 1000 according to an embodiment of the present disclosure has a structure in which the second substrates 112 that are relatively rigid are disposed and spaced apart from each other on the first substrate 111 that is relatively flexible. The cathodes 153 and the encapsulation layers 180 of the stretchable display device 1000 are patterned to correspond to the second substrates 112, respectively. That is, the stretchable display device 1000 according to an embodiment of the present disclosure may have a structure that enables the stretchable display device 1000 to be more easily deformed when a user stretches or bends the stretchable display device 1000 and that may minimize damage to the components of the stretchable display device 1000 when the stretchable display device 1000 is deformed.

Referring to FIG. 5, an adhesive layer 190, an upper substrate 120, and a polarizing plate 121 are disposed on the lower substrate 110 having the encapsulation layer 180 thereon.

The upper substrate 120 is a substrate supporting various components disposed under the second substrate 120. The second substrate 120 may be bonded to the lower substrate 110 by the adhesive layer 190.

The polarizing plate 121 is disposed on the second substrate 120. The polarizing plate 121 may polarize light traveling into the stretchable display device 1000 from the outside. Light traveling in the stretchable display device 1000 and polarized through the polarizing plate 121 may be reflected in the stretchable display device 1000, so the phase of the light may be changed. Some of the light with the changed phase may not pass through the polarizing plate 121. Accordingly, the light traveling in the stretchable display device 1000 from the outside of the stretchable display device 1000 is not discharged back to the outside of the stretchable display device 1000, so the external light reflection of the stretchable display device 1000 may be reduced.

Although an organic light emitting element is exemplified as a light emitting element in FIG. 5, the light emitting elements of the stretchable display device 1000 may be micro LEDs. The structure of one subpixel when the light emitting elements of the stretchable display device 1000 according to an embodiment of the present disclosure are micro LEDs is described hereafter.

Figure 6:
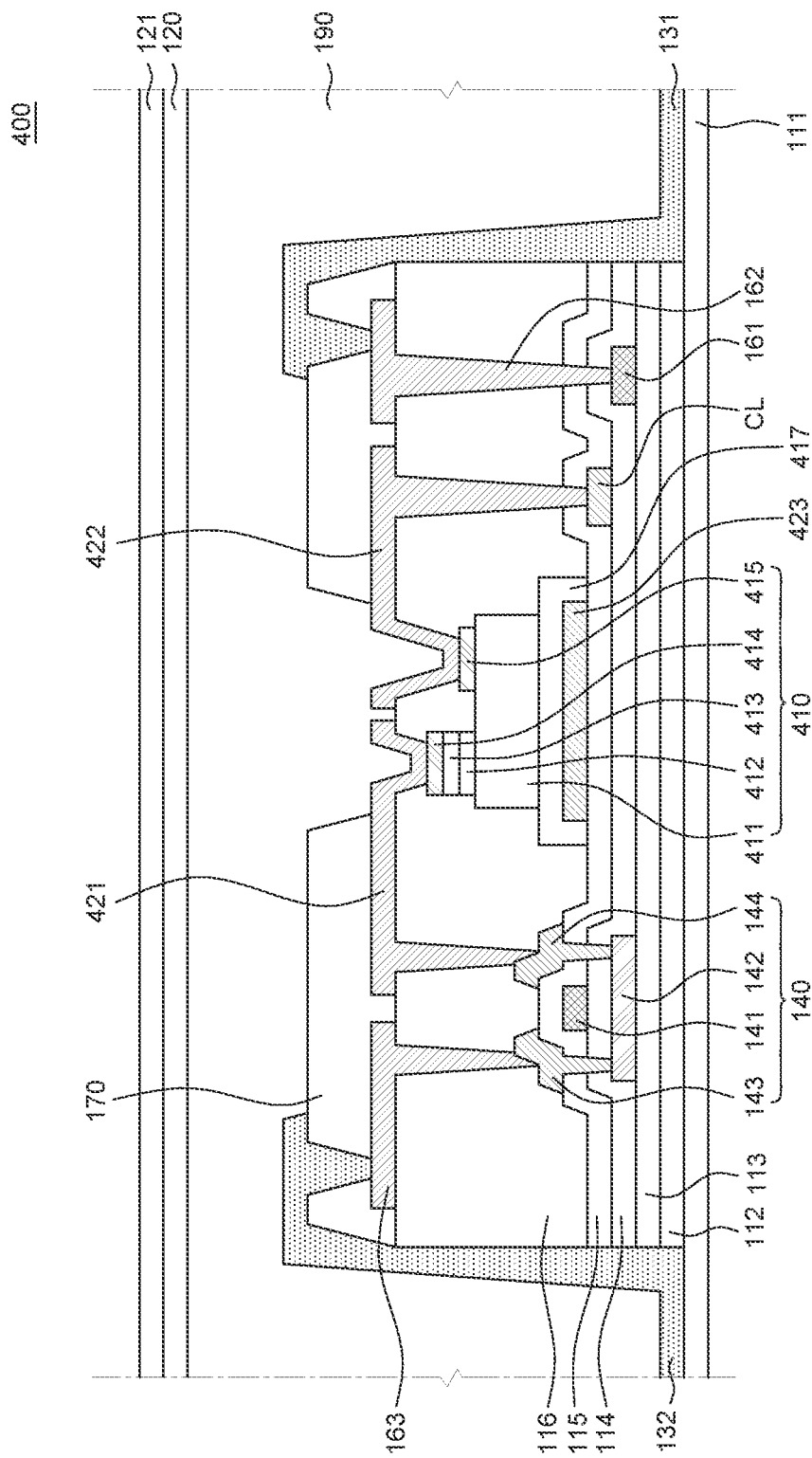
FIG. 6 is a schematic cross-sectional view of one subpixel according to another embodiment of FIG. 4A.

FIG. 6 is a schematic cross-sectional view of one subpixel according to another embodiment of FIG. 4A.

The structure of one subpixel shown in FIG. 6 is substantially the same as the structure of the subpixel shown in FIG. 5 except for having a different light emitting element, so the components having the same reference numerals are not described.

Referring to FIG. 6, a common line CL is disposed on the gate insulating layer 114. The common line CL is a line for applying a common voltage to a plurality of subpixels SPX. The common line CL may be made of the same material as the source electrode 143 and the drain electrode 144 of the transistor 140, but is not limited thereto.

A reflective layer 423 is disposed on the inter-layer insulating layer 115. The reflective layer 423 is a layer for discharging light emitted to the lower substrate 110 of light emitting from the LED 410 to the outside by reflecting the light upward through a stretchable display device 1000. The reflective layer 423 may be made of metal having high reflectance.

A first adhesive layer 417 is disposed on the reflective layer 423 to cover the reflective layer 423. The first adhesive layer 417, which is a layer for bonding the LED 410 on the reflective layer 423, may insulate the reflective layer 423 made of metal and the LED 410. The first adhesive layer 417 may be made of a thermosetting material or a photocuring material, but is not limited thereto. Although the first adhesive layer 417 covers only the reflective layer 423 in FIG. 6, the position of the first adhesive layer 417 is not limited thereto.

The LED 410 is disposed on the first adhesive layer 417. The LED 410 overlaps the reflective layer 423. The LED 410 includes an n-type layer 411, an active layer 412, a p-type layer 413, a p-electrode 414, and an n-electrode 415. The LED 410 is described as a lateral LED 410 hereafter, but the structure of the LED 410 is not limited thereto.

In detail, the n-type layer 411 of the LED 410 overlaps the reflective layer 423 on the first adhesive layer 417. The n-type layer 411 may be formed by implanting an n-type impurity into a gallium nitride having excellent crystallinity. The active layer 412 is disposed on the n-type layer 411. The active layer 412, which is a light emitting layer that emits light in the LED 410, may be made of a nitride semiconductor, for example, an indium gallium nitride. The p-type layer 413 is disposed on the active layer 412. The p-type layer 413 may be formed by implanting a p-type impurity into a gallium nitride. However, the materials of the n-type layer 411, the active layer 412, and the p-type layer 413 are not limited thereto.

The p-electrode 414 is disposed on the p-type layer 413 of the LED 410. The n-electrode 415 is disposed on the n-type layer 411 of the LED 410. The n-electrode 415 is spaced apart from the p-electrode 414. In detail, the LED 410 may be manufactured by sequentially stacking the n-type layer 411, the active layer 412, and the p-type layer 413, etching a predetermined portion of the active layer 412 and the p-type layer 413, and forming the n-electrode 415 and the p-electrode 414. The predetermined portion is a space for spacing the n-electrode 415 and the p-electrode 414 and the predetermined portion may be etched to expose a portion of the n-type layer 411. In other words, the surface of the LED 410 where the n-electrode 415 and the p-electrode 414 are disposed is not a planarized surface and may have different levels. Accordingly, the p-electrode 414 is disposed on the p-type layer 413, the n-electrode 415 is disposed on the n-type layer 411, and the p-electrode 414 and the n-electrode 415 are spaced from each other at different levels. Therefore, the n-electrode 415 may be disposed adjacent to the reflective layer 423 in comparison to the p-electrode 414. The n-electrode 415 and p-electrode 414 may be made of a conductive material, for example, a transparent conductive oxide. Alternatively, the n-electrode 415 and p-electrode 414 may be made of the same material, but are not limited thereto.

A planarization layer 116 is disposed on the inter-layer insulating layer 115 and the first adhesive layer 417. The planarization layer 116 is a layer that planarizes the top of the transistor 140. The planarization layer 116 may be disposed in an area excepting the area where the LED 410 is disposed while planarizing the top of the transistor 140. The planarization layer 116 may be composed of two or more layers.

A first electrode 421 and a second electrode 422 are disposed on the planarization layer 116. The first electrode 421 is an electrode that electrically connects the transistor 140 and the LED 410. The first electrode 421 is connected with the p-electrode 414 of the LED 410 through a contact hole formed at the planarization layer 116. The first electrode 421 is connected with the drain electrode 144 of the transistor 140 through contact holes formed at the planarization layer 116 and the inter-layer insulating layer 115. However, the first electrode 421 is not limited thereto and may be connected with the source electrode 143 of the transistor 140, depending on the type of the transistor 140. The p-electrode 414 of the LED 410 and the drain electrode 144 of the transistor 140 may be electrically connected by the first electrode 421.

The second electrode 422 is an electrode that electrically connects the LED 410 and the common line CL. In detail, the second electrode 422 is connected with the common line CL through contact holes formed at the planarization layer 116 and the inter-layer insulating layer 115 and is connected with the n-electrode 415 of the LED 410 through a contact hole formed at the planarization layer 116. Accordingly, the common line CL and the n-electrode 415 of the LED 410 are electrically connected.

When a stretchable display device 1000 is turned on, voltages having different levels may be applied respectively to the drain electrode 144 of the transistor 140 and the common line CL. The voltage that is applied to the drain electrode 144 of the transistor 140 may be applied to the first electrode 421 and a common voltage may be applied to the second electrode 422. Voltages having different levels may be applied to the p-electrode 414 and the n-electrode 415 through the first electrode 421 and the second electrode 422, so the LED 410 may emit light.

Although the transistor 140 is electrically connected with the p-electrode 414 and the common line CL is electrically connected with the n-electrode 415 in the description referring to FIG. 6, they are not limited thereto. That is, the transistor 140 may be electrically connected with the n-electrode 415 and the common line CL may be electrically connected with the p-electrode 414.

A bank 170 is disposed on the planarization layer 116, the first electrode 421, the second electrode 422, the data pad 163, and the connecting pad 162. The bank 170 is disposed to overlap an end of the reflective layer 423 and a portion not overlapped with the bank 170 of the reflective layer 423 may be defined as a light emitting area. The bank 170 may be made of an organic insulating material and may be made of the same material as the planarization layer 116. The bank 170 may include a black material to suppress mixing of colors due to light emitted from the LED 410 and transmitted to an adjacent subpixel SPX.

As described above, the light emitting elements of the stretchable display device 1000 according to an embodiment of the present disclosure may be organic light emitting elements, but may alternatively be LEDs 410. Since the LED 410 is made of not an organic material, but an inorganic material, reliability is high, so the lifespan is longer than that of a liquid crystal display element or an organic light emitting element. The LED 410 is quickly turned on, consumes a small amount of power, has high stability because it has high shock-resistance, and may display high-luminance images because it has high emission efficiency. Accordingly, the LED 410 is an element that is suitable to be applied even to very large screens. In particular, since the LED 410 is made of not an organic material, but an inorganic material, an encapsulation layer that is required when an organic light emitting element is used may not be used. Accordingly, the encapsulation layer that may be easily damaged, such as cracking, when the stretchable display device 1000 is stretched may not be provided. Accordingly, it is possible not to use an encapsulation layer that may be damaged when the stretchable display device 1000 according to another embodiment of the present disclosure is deformed such as bending and stretching, by using the LED 410 as a light emitting element in the stretchable display device 1000. Further, since the LED 410 is made of not an organic material, but an inorganic material, the light emitting elements of the stretchable display device 1000 according to another embodiment of the present disclosure may be protected from water or oxygen and their reliability may be high.

In a stretchable display device according to an embodiment of the present disclosure, the shape of the second substrate 112 that is disposed in the non-active area N/A may vary depend on what shape the gate driving circuit is disposed in the non-active area N/A disposed outside the active area A/A.

In general, a gate driving circuit may be formed independently from a display panel and electrically connected with the display panel in various ways. Recently, a gate driving circuit may be mounted with pixel arrays arranged in the active area A/A in a display panel as a design for reducing a bezel area, which is called a Gate In Panel (hereafter, referred to as 'GIP'). Accordingly, a stretchable display device according to an embodiment of the present disclosure is also described for the case when a gate driving circuit is formed independently from a display panel and the case when a gate driving circuit is disposed in a display panel.

First, the case when a gate driving circuit is configured in the GIP type in a non-active area N/A is exemplified.

Figure 7:
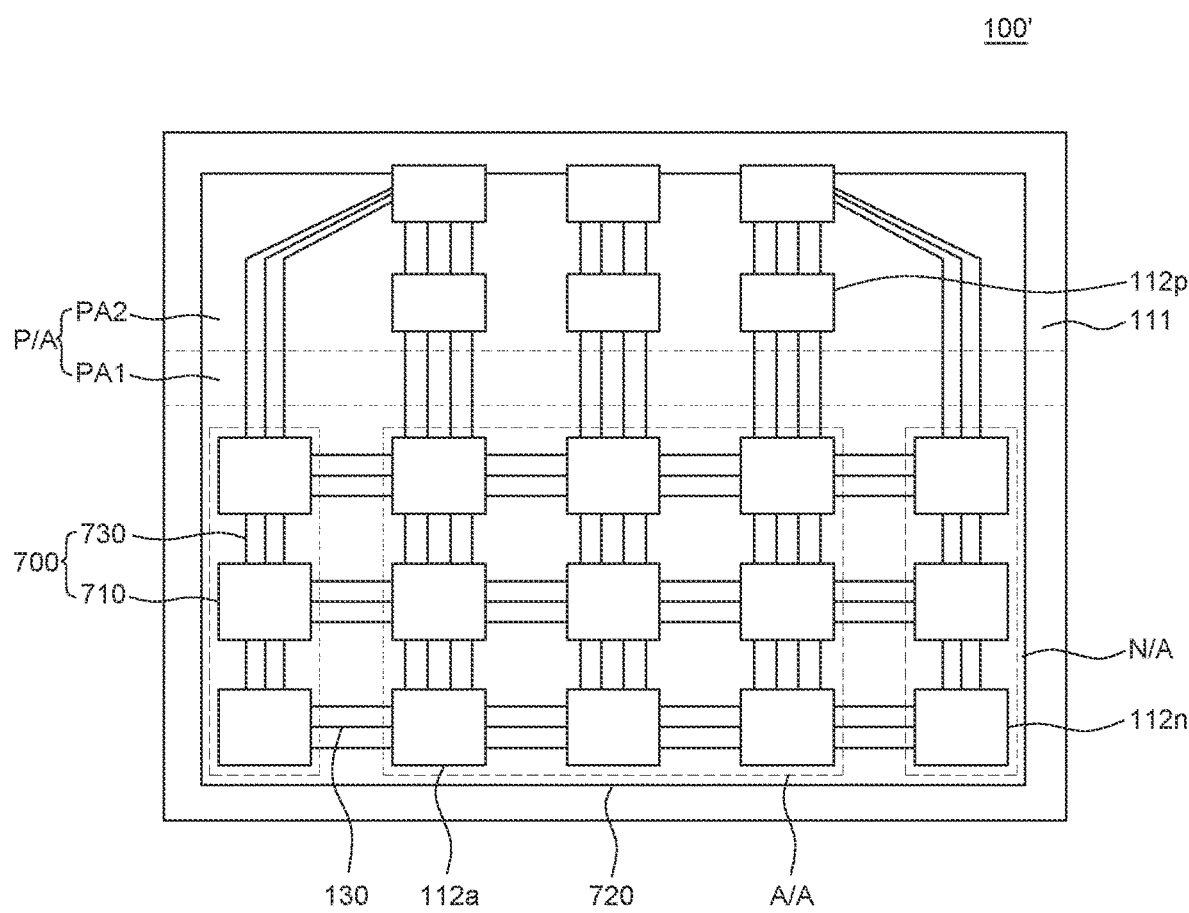
FIG. 7 is a plan view schematically showing the edge portion of a stretchable display panel according to another embodiment of the present disclosure.
Figure 8:
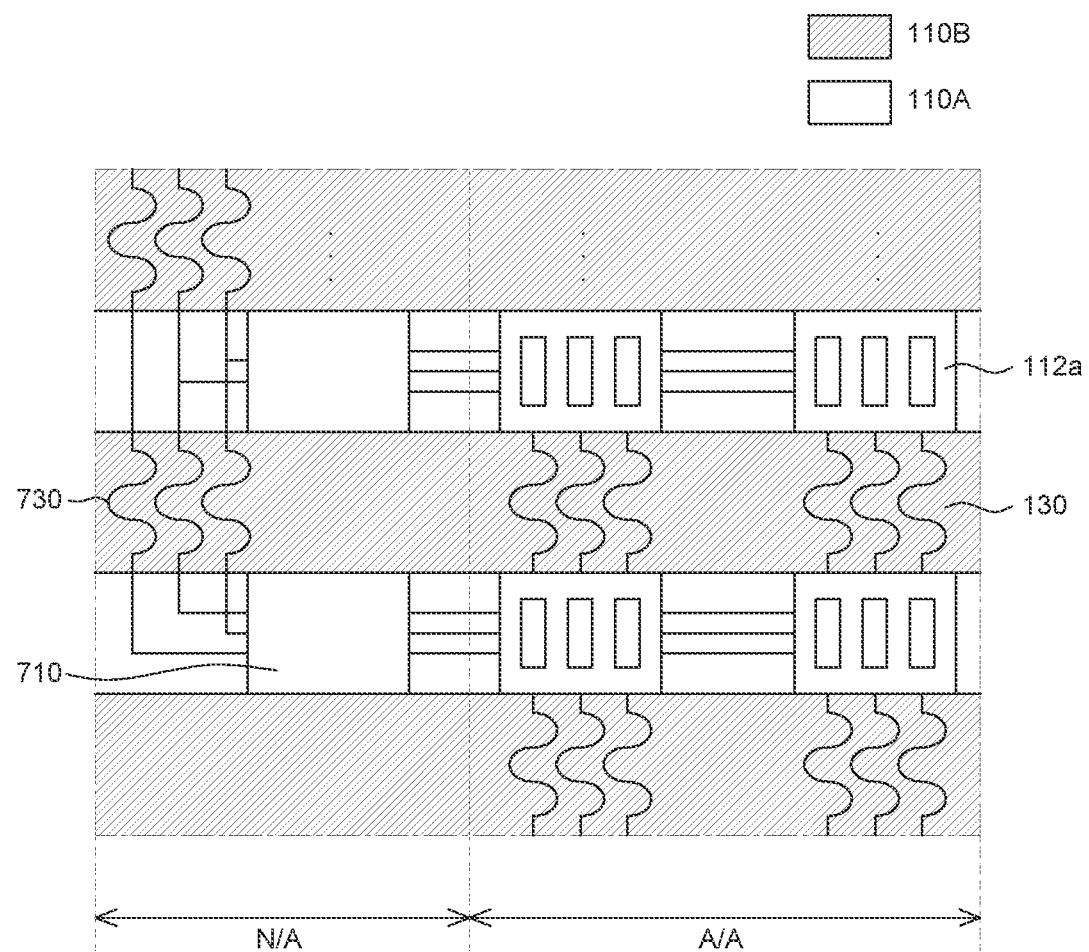
FIG. 8 is an enlarged plan view schematically showing a partial area of FIG. 7.

FIG. 7 is a plan view schematically showing the edge portion of a stretchable display device according to another embodiment of the present disclosure. FIG. 8 is an enlarged plan view schematically showing a partial area of FIG. 7.

First, referring to FIG. 7, a stretchable display panel 100' according to another embodiment of the present disclosure may include a first substrate 111 and second substrates 112a, 112n, and 112p having different moduli. The stretchable display panel 100' according to another embodiment of the present disclosure may include an active area A/A, a non-active area N/A surrounding the active area A/A, and a pad area P/A to which a side of the non-active area N/A extends and that may bend. In particular, various driving circuits may be disposed in the non-active area N/A of the stretchable display panel 100' according to another embodiment of the present disclosure. In particular, a gate driving circuit 700 may be disposed in the GIP structure in the non-active area N/A.

The gate driving circuit 700 sequentially supplies a gate signal to connecting lines 130, which function as gate lines, in response to a gate driving control signal transmitted from a controller disposed on a printed circuit board 300. The gate driving circuit 700 may include a plurality of stages 710 composed of a plurality of shift registers and level shifters.

The stages 710, which are circuit elements constituting the gate driving circuit 700, may include thin film transistors that are the same type as a plurality of thin film transistors disposed in the active area A/A. Accordingly, the stages 710 may be disposed on the second substrates 112n made of a material more rigid than the first substrate 111.

The first set of the second substrates 112n are substrates that are more rigid than the flexible substrate 111, but are still flexible substrates with less elasticity. The second substrates 112n, for example, may be made of Polyimide (PI)-based resin or epoxy-based resin. The second substrates 112n are spaced apart from each other on the first substrate 111. The modulus of the second substrates 112n may be a thousand times larger than that of the first substrate 111, but is not limited thereto.

The stages 710 may be spaced apart from each other with predetermined gaps. In more detail, the stages 710 may be disposed to correspond to the areas where the second set of the second substrates 112a are disposed in the active area A/A. For example, the stages 710 may be spaced by a first gap from each other in the second direction Y. In this case, the second substrates 112a in the active area A/A also may be spaced by the first gap from each other in the second direction Y. The stages 710 may be spaced by the distance between the second substrates 112a disposed in the active area A/A apart from each other in the first direction X. That is, the distance between the outermost second substrates 112a in the active area A/A and the second substrates 112n having the stages 710 in the non-active area N/A may be the same as the distance between any one second substrate 112a of the second substrates 112a in the active area A/A and a second substrate 112a disposed adjacent to the any one second substrate 112a.

Gate driving connecting lines 730 may be disposed between the second substrates 112n having the stages 710. The gate driving connecting lines 730 may be disposed between the pads disposed on the second substrates 112n and may electrically connect the pads. That is, a gate driving connecting line 730 electrically connects the pads on two adjacent individual substrates, that is, the second substrates 112n. Accordingly, the stretchable display panel 100' according to an embodiment of the present disclosure includes a plurality of gate driving connecting lines 730 to electrically connect various lines such as gate driving lines or high-potential power lines between the second substrates 112n. For example, a gate driving line may be disposed on the second substrates 112n disposed adjacent to each other in the second direction Y and gate driving pads may be disposed at both ends of the gate driving line. The gate driving pads on the second substrates 112n disposed adjacent to each other in the second direction Y may be connected to each other by a gate driving connecting line 730 functioning as a gate driving line. Accordingly, the gate driving line disposed on the second substrates 112n and the gate driving connecting line 730 disposed on the first substrate 111 may function as one gate driving line.

Referring to FIGS. 7 and 8, the gate driving connecting line 730 includes a base polymer and conductive particles. The base polymer of the gate driving connecting line 730 may be made of a bendable or stretchable insulating material similar to the first substrate 111. The base polymer, for example, may include silicon rubber such as Polydimethylsiloxane (PDMS), an elastomer such as polyurethane (PU), Styrene Butadiene Styrene (SBS), etc., but is not limited thereto. Accordingly, when the stretchable display device 1000 is bent or stretched, the base polymer may not be damaged. The base polymer may be formed by coating a material for the base polymer or applying the material using a slit to the top surface of the first substrate 111 and the bottom surface of the second substrates 112n.

The conductive particles of the gate driving connecting line 730 may be distributed by the base polymer. In detail, the gate driving connecting line 730 may include conductive particles distributed with predetermined density in the base polymer. The gate driving connecting line 730, for example, may be formed by uniformly dispersing conductive particles in a base polymer and then coating or hardening the base polymer with the conductive particles distributed therein onto the top surface of the first substrate 111, the bottom surface of the second substrates 112n, and the bottom surface of an adhesive layer, but is not limited thereto. The conductive particles may include at least one of silver (Ag), gold (Au), and carbon, but is not limited thereto.

The conductive particles distributed in the base polymer of the gate driving connecting line 730 may form a conductive path electrically connecting the gate driving pads of shift registers disposed on adjacent second substrates 112n.

When the stretchable display device 1000 is bent or stretched, the first substrate 111 that is a flexible substrate may be deformed but the second substrates 112n that are individual substrates that are rigid substrates having the shift registers thereon constituting the gate driving circuit may not be deformed. In this case, if the lines connecting the pads disposed on the individual substrates are not made of an easily bendable or stretchable material, the lines may be damaged, such as cracking, due to deformation of the lower substrate.

However, in the stretchable display device 1000 according to another embodiment of the present disclosure, it is possible to electrically connect the driving pads disposed on the second substrates 112n, using the gate driving connecting lines 730 including a base polymer and conductive particles. The base polymer is flexible to be able to easily deform. Accordingly, according to the stretchable display device 1000 of another embodiment of the present disclosure, even though the stretchable display device 1000 is deformed such as bending or stretching, the areas between the second substrates 112n are easily deformed by the gate driving connecting lines 730 including the base polymer.

Further, according to the stretchable display device 1000 of another embodiment of the present disclosure, since the gate driving connecting lines 730 include conductive particles, the conductive paths composed of the conductive particles may not be damaged such as cracking even by deformation of the base polymer. For example, when the stretchable display device 1000 is deformed such as bending or stretching, the first substrate 111 that is a flexible substrate may be deformed in the other areas excepting the areas where the second substrates 112*n* that are rigid substrates are disposed. The distance between the conductive particles disposed on the deforming first substrate 111 may be changed. The density of the conductive particles disposed at the upper portion of the base polymers and forming the conductive paths may be maintained at a high level to be able to transmit electrical signals even though the distance between the conductive particles is increased. Accordingly, even if the base polymers are bent or stretched, the conductive paths formed by the conductive particles may smoothly transmit electrical signals. Further, even though the stretchable display device 1000 is deformed such as bending or stretching, electrical signals may be transmitted between the pads.

Referring to FIG. 7, the base polymer and the conductive particles distributed in the base polymer of the gate driving connecting lines 730 may connect straight the gate driving pads disposed on adjacent second substrates 112*n*. Accordingly, since the gate driving connecting lines 730 include a base polymer and conductive particles, the gate driving connecting lines 730 connecting the pads disposed on adjacent second substrates 112*n* may be disposed straight to have a minimum length. That is, the stretchable display device 1000 may be achieved even if the gate driving connecting lines 730 are not curved. To this end, base polymers may be formed in a straight shape connecting the second substrates 112*n* in the manufacturing process. Accordingly, the conductive paths formed by the conductive particles distributed in the base polymers also may be straight. However, the shape and the process of forming the base polymer and the conductive particles of the gate driving connecting lines 730 may not be limited thereto. Therefore, in the stretchable display device 1000 according to another embodiment of the present disclosure, it is possible to minimize the space occupied by the gate driving connecting lines 730.

The gate driving connecting lines 730 are straight in FIG. 7, but they are not limited thereto and may have a wave form, as shown in FIG. 8, to suppress damage to the gate driving connecting lines 730 when the display panel 100 is stretched. As shown in FIG. 8, when the gate driving connecting lines 730 has a wave form, the gate driving connecting lines 730 may be made of metal, not composed of a base polymer and conductive particles. As described above, since the gate driving connecting lines 730 has a wave form, cracks that may be generated in the gate driving connecting lines 730 of the stretchable display device 1000 according to an embodiment of the present disclosure are minimized, thereby being able to improve the reliability of the stretchable display device 1000.

Referring to FIG. 8, a first area 110A and a second area 110B having different moduli, as described above with reference to FIGS. 2A to 3B, may be defined in the non-active area N/A of the lower substrate 110 of the stretchable display panel 100' according to another embodiment of the present disclosure.

The first area 110A may have a larger modulus than the second area 110B. The modulus is an elastic modulus showing the ratio of deformation of a substrate to stress applied to the substrate, and when the modulus is relatively high, the strength may be relatively high. Accordingly, the first area 110A may be a rigid area that is more rigid than the second area 110B.

In more detail, the first area 110A is an area where the second substrates 112*n* made of a relatively rigid material are disposed and an area where a plurality of stages is disposed. The second area 110B, which is an area without the second substrates 112*n*, may be an area where the gate driving connecting lines 730 are disposed. The first area 110A may have a larger modulus than the second area 110B. The modulus is an elastic modulus showing the ratio of deformation of a substrate due to stress applied to the substrate, and when the modulus is relatively high, the rigidity may be relatively high. Accordingly, the first area 110A may be a rigid area that is more rigid than the second area 110B. Accordingly, a plurality of thin film transistors and driving elements constituting a gate driving circuit may be disposed in the first area 110A, that is, in the second substrates 112*n*.

The second area 110B disposed in the non-active area N/A may extend from the active area A/A in the first direction X. That is, the second area 110B in the active area A/A and the second area 110B in the non-active area N/A may extend in the first direction X, and may be disposed between any one first area 110A of a plurality of first areas 110A disposed in the second direction Y and a first area 110A disposed adjacent to the any one first area 110A.

The second area 110B disposed in the non-active area N/A is an area in which the second substrates 112*n* are spaced apart and is an area where the gate driving connecting line 730 is disposed.

The first area 110A and the second area 110B are alternately disposed in the second direction Y in the non-active area N/A. Accordingly, the first area 110A and the second area 110B disposed in the active area A/A may be disposed to correspond to each other in the second direction Y. That is, the first area 110A in the active area A/A may extend in the first direction X to correspond to the first area 110A in the non-active area N/A. Further, the second area 110B in the active area A/A may extend in the first direction X to correspond to the second area 110B in the non-active area N/A.

A low-potential voltage line 720 is disposed around the edge of the lower substrate 110. The low-potential voltage line 720 is a line transmitting low-potential power to the light emitting elements disposed on the second substrates 112 in the active area A/A. The low-potential voltage line 720 is disposed around the edge of the lower substrate 110 on the lower substrate 110. Although the low-potential voltage line 720 is disposed only in the non-active area N/A on the first substrate 111 in this embodiment, it is not limited thereto and may be disposed on the second substrates 112*n*.

As described above, according to the stretchable display panel 100' of an embodiment of the present disclosure, the gate driving circuit 700 that applies a gate signal to the light emitting elements disposed in the active area A/A may be disposed in the display panel 100'. Therefore, the printed circuit board 300 and the gate driving circuit 700 are directly connected without disposing a separate flexible connecting film 200 in the second direction Y, so the bezel at the left and right sides of the stretchable display panel 100' may be reduced.

The second substrates 112*n* on which the stages 710 constituting the GIP type gate driving circuit are disposed and the second substrates 112*a* in the active area A/A are disposed in the same lines in the first direction X in the stretchable display panel 100' according to an embodiment of the present disclosure. Further, the gate driving connecting lines 730 connecting the stages 710 and the connecting lines 130 connecting the second substrates 112*a* disposed in the active area A/A are disposed in the same lines in the first direction X. Accordingly, damage to the driving elements constituting the GIP panel due to stretching may be minimized and the entire area may be uniformly stretched.

Figure 9:
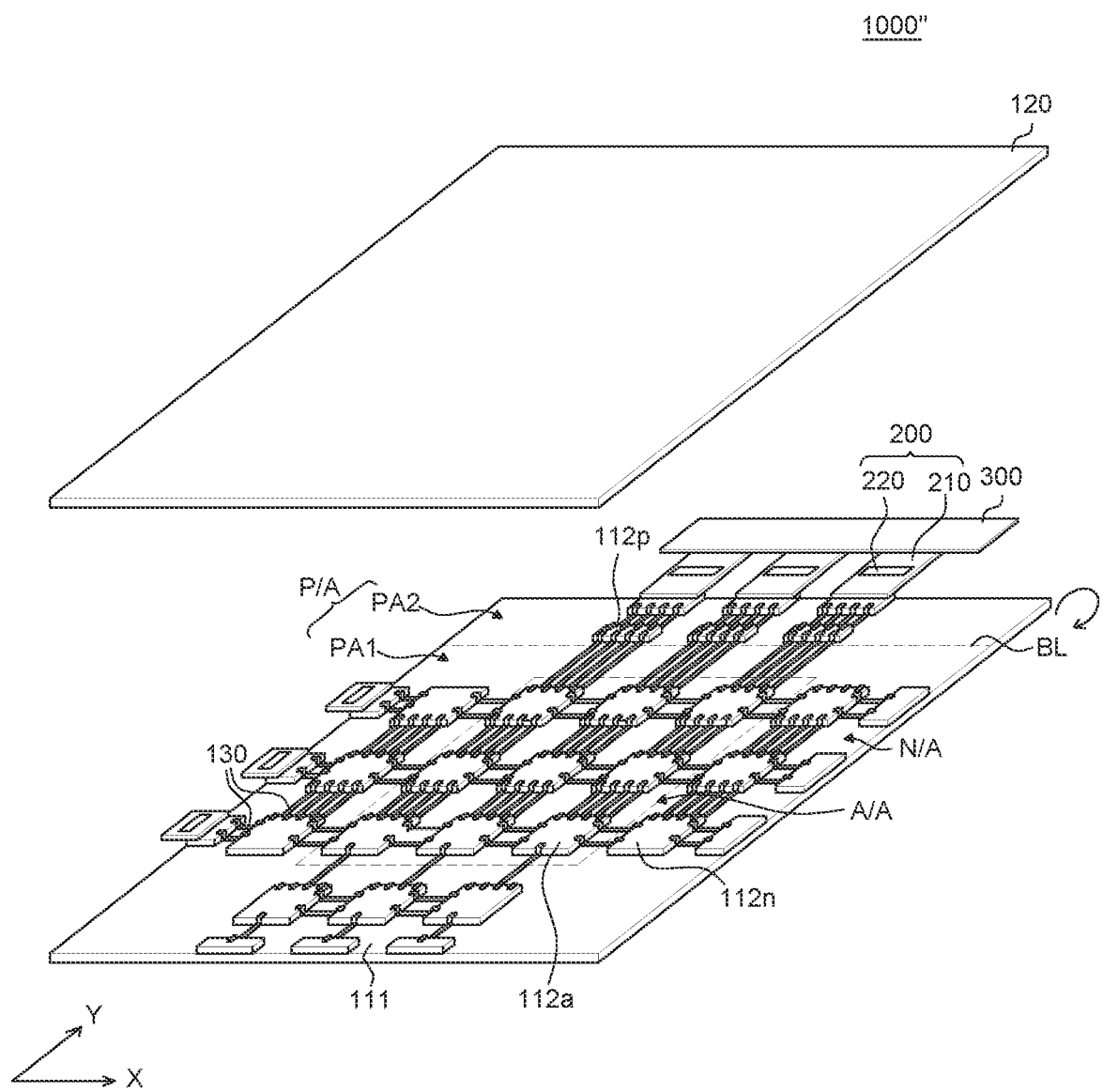
FIG. 9 is a schematic exploded perspective view showing a stretchable display device according to another embodiment of the present disclosure.
Figure 10:
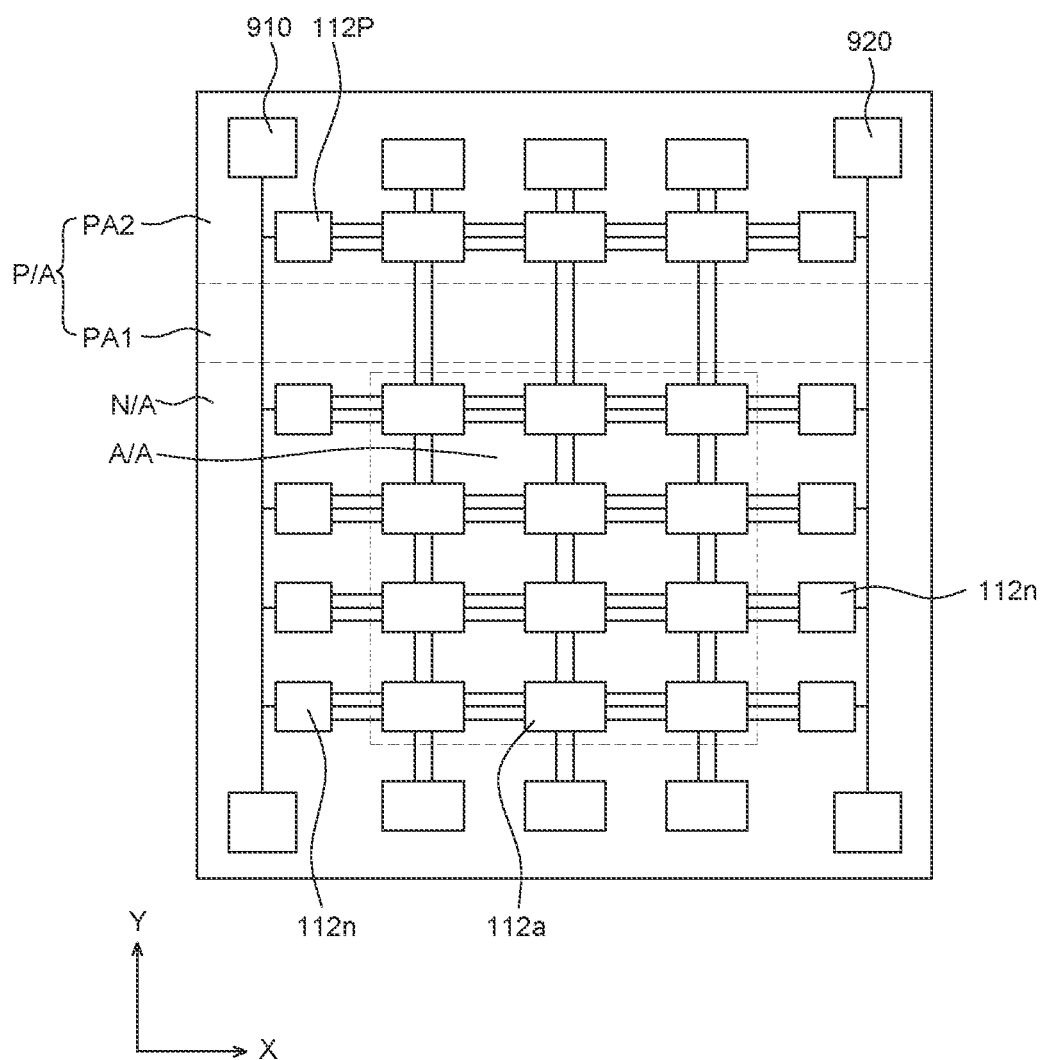
FIG. 10 is a schematic plan view of the stretchable display panel shown in FIG. 9.
Figure 11:
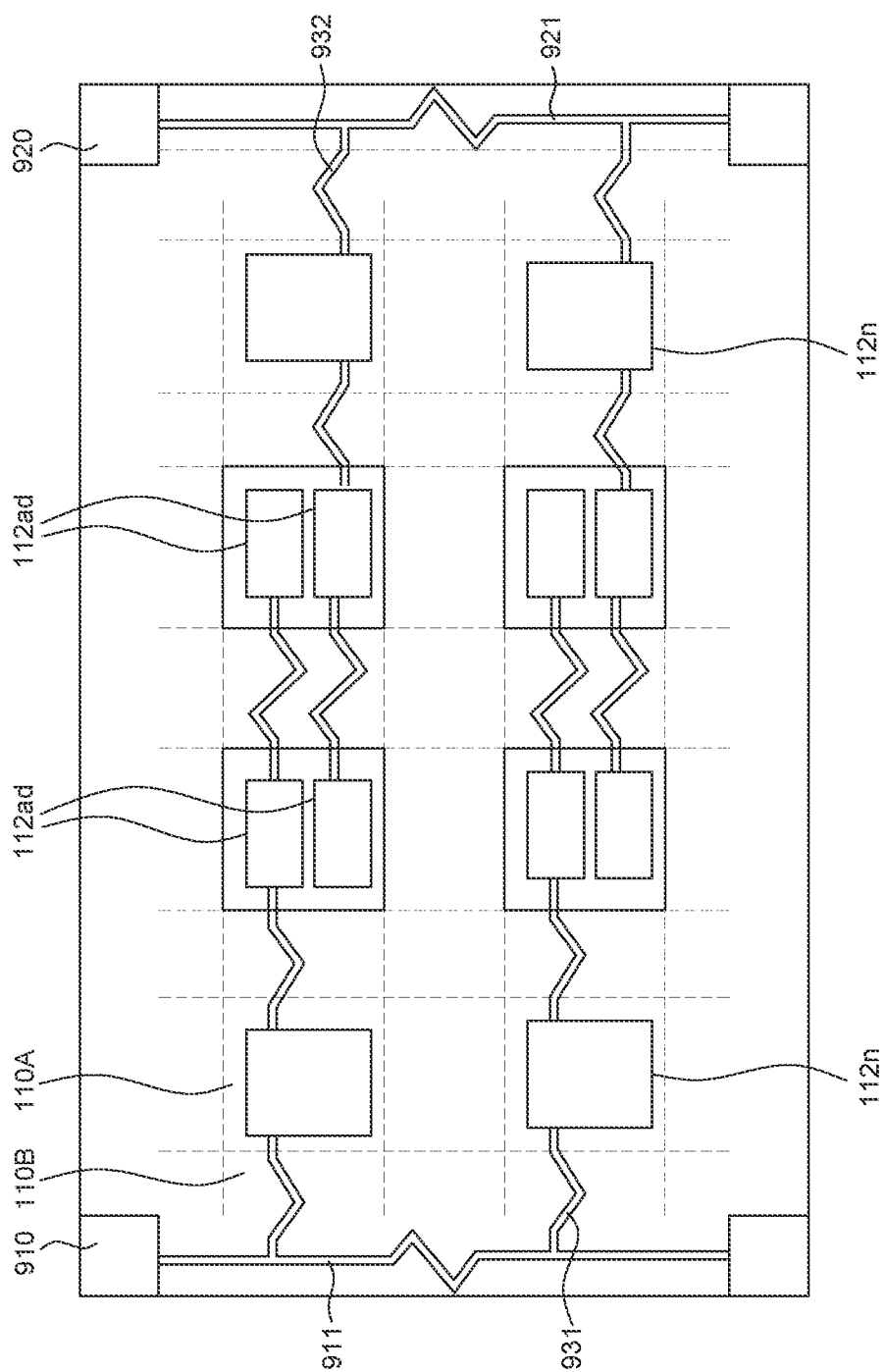
FIG. 11 is an enlarged plan view schematically showing a partial area of FIG. 10.

FIG. 9 is a schematic plan view of the stretchable display device according to still another embodiment of the present disclosure. FIG. 10 is a schematic plan view showing a stretchable display panel according to still another embodiment of the present disclosure. FIG. 11 is an enlarged plan view schematically showing a partial area of FIG. 10. In more detail, FIG. 10 is a view simply showing a display panel to illustrate a connection relationship with power pads. FIG. 11 is a view illustrating in detail arrangement of a high-potential power line and a low-potential power line. In FIG. 11, connecting lines electrically connecting pixels, gate lines, data lines, etc., are not shown and only the high-potential power line and the low-potential power line are shown.

Referring to FIG. 9, a stretchable display panel 100" according to still another embodiment of the present disclosure includes an active area A/A, a non-active area N/A, and a pad area P/A. Compared with FIG. 1A, the same reference numerals are used except for the configuration of the gate driving circuit disposed separately from the display panel 100 because all components are the same except that the gate driving circuit is disposed like a flexible connecting film in FIG. 9, which is not described in detail. Referring to FIG. 9, a gate driving circuit 250 is disposed separately from the display panel 100" in the non-active area N/A. That is, a plurality of gate driving circuits 250 may be disposed in the second direction Y in the form of the flexible connecting films 200. Accordingly, a high-potential power pad and a low-potential power pad may be disposed around the edge of the non-active area N/A of a stretchable display device 1000" according to still another embodiment of the present disclosure. Thus, the configuration of the non-active area N/A is disposed differently from the above description. The configuration of the non-active area N/A of a stretchable display device 1000" according to still another embodiment of the present disclosure is described hereafter in more detail with reference to FIGS. 10 and 11.

Referring to FIG. 10, high-potential power pads 910, lower-potential power pads 920, first power lines 911 electrically connecting the high-potential power pads 910 disposed at both ends, second power lines 921 electrically connecting the low-potential power pads 920 are disposed in non-active area N/A of the stretchable display panel 100" according to still another embodiment of the present disclosure. Further, second substrates 112n disposed to correspond to an active area A/A, first power connecting lines 931 electrically connecting the first power lines 911 and the second substrates 112n, and second power connecting line 932 electrically connecting the second power lines 921 and the second substrates 112n are also disposed in the non-active area N/A.

The high-potential power pads 910 are disposed at both ends of an edge in the second direction Y of the non-active area N/A and receive high-potential power from the outside. The high-potential power pads supply high-potential power to driving elements disposed on second substrates 112a disposed in the active area A/A through the first power lines 911 and the first power connecting lines 931.

The first power lines 911 electrically connect the high-potential power pads 910 disposed at both ends of the non-active area N/A.

The first set of second substrates 112n are disposed in the non-active area N/A and may receive high-potential power from the high-potential power pads 910. The first set of second substrates 112n are electrically connected with the second set of second substrates 112a disposed in the active area A/A, so the high-potential power applied to the first set of second substrates 112n in the non-active area N/A may be applied to the second substrates 112a disposed in the active area A/A. Referring to FIG. 11, a dummy pixel may be disposed on the second substrate 112n disposed most adjacent to the active area A/A of the plurality of second substrates 112n of the first set of disposed in the non-active area N/A. The dummy pixel may have the same shape as the pixels disposed in the active area A/A. Accordingly, the dummy pixel also may be disposed on second set substrates 112ad in the non-active area N/A. However, the first second substrates 112ad having dummy pixels may have different shape from the second substrates 112a disposed in the active area A/A and the second substrates 112n disposed in the non-active area. That is, the second substrates 112ad having dummy pixels, as shown in FIG. 11, may have a different size from the second substrates 112a in the active area A/A and the second substrates 112n in the non-active area N/A. In more detail, the second substrates 112ad having dummy pixels may be larger in size than the second substrates 112a in the active area A/A and the second substrates 112n in the non-active area N/A.

The first power connecting lines 931 may connect the first power lines 911 and the second substrates 112n in the non-active area N/A or may connect the second substrates 112n and the second substrates 112ad having dummy pixels. The first power connecting lines 931 may apply the high-potential power applied from high-potential power lines to the high-potential power lines disposed in the active area A/A. The high-potential power lines in the active area A/A may be connecting lines 130 disposed in the active area A/A.

The low-potential power pads 920 are disposed at both ends of another edge in the second direction Y of the non-active area N/A and receive low-potential power from the outside. The low-potential power pads supply low-potential power to driving elements disposed on second substrates 112a disposed in the active area A/A through the second power lines 921 and the second power connecting lines 932.

The second power lines 921 electrically connect the low-potential power pads 920 disposed at both ends of the non-active area N/A.

The plurality of second substrates 112n is disposed in the non-active area N/A and may receive low-potential power from the low-potential power pads 920. The second substrates 112n are electrically connected with the second substrates 112a disposed in the active area A/A, so the low-potential power applied to the second substrates 112n in the non-active area N/A may be applied to the second substrates 112a disposed on the active area A/A. Referring to FIG. 11, a dummy pixel may be disposed on the second substrate 112n disposed most adjacent to the active area A/A of the plurality of second substrates 112n disposed in the non-active area N/A. The dummy pixel may have the same shape as the pixels disposed in the active area A/A. Accordingly, the dummy pixel also may be disposed on second substrates 112ad in the non-active area N/A. However, the second substrates 112ad having dummy pixels may have different shape from the second substrates 112a disposed in the active area A/A and the second substrates 112n disposed in the non-active area. That is, the second substrates 112ad having dummy pixels, as shown in FIG. 11, may have a different size from the second substrates 112a in the active area A/A and the second substrates 112n in the non-active area N/A. In more detail, the second substrates 112ad having dummy pixels may be larger in size than the second substrates 112a in the active area A/A and the second substrates 112n in the non-active area N/A.

The second power connecting lines 932 may connect the second power lines 921 and the second substrates 112n in the non-active area N/A or may connect the second substrates 112n and the second substrates 112ad having dummy pixels. The second power connecting lines 932 may apply the low-potential power applied from low-potential power lines to the low-potential power lines disposed in the active area A/A. The low-potential power lines in the active area A/A may be connecting lines 130 disposed in the active area A/A.

The second substrates 112n in the non-active area N/A, as described above, may have different shape from the second substrate 112ad having dummy pixels, which is described in detail hereafter.

Referring to FIG. 11, the second substrates 112ad disposed in the non-active area N/A are, in more detail, disposed most adjacent to the active area A/A. Dummy pixels may be disposed on the second substrates 112ad. The second substrates 112ad having dummy pixels include a first sub-substrate and a second sub-substrate. The first sub-substrate and the second sub-substrate are respectively connected with the first power connecting lines 931 and the second power connecting lines 932. In other words, the substrates 112ad having dummy pixels each may be composed of two individual substrates and the second substrates 112n without a dummy pixel may be configured in a single individual substrate shape. Each of the two individual substrates of the second substrates 112ad having dummy pixels may be smaller in size than the individual substrates of the second substrate 112n without a dummy pixel.

The first power connecting lines 931 are electrically connected with the high-potential power pads 910 and transmit high-potential power.

The second power connecting lines 932 are electrically connected with the low-potential power pads 920 and transmit low-potential power.

As described above, the second substrates 112ad in the non-active area N/A are separated into the first sub-substrate and the second sub-substrate such that the high-potential power and the low-potential power are separated and electrically connected. Accordingly, power lines may be more easily designed in the stretchable display device 1000".

Further, since the second substrates 112ad having dummy pixels are separated into two sub-substrates, the rigid area and the flexible area of the stretchable display device 1000" according to still another embodiment of the present disclosure may be proportionally adjusted. Accordingly, the stretchable display device 1000" according to still another embodiment of the present disclosure may be uniformly stretched throughout the area.

The first area 110A that is a rigid area and the second area 110B that is a flexible area are alternately disposed throughout the non-active area N/A, the active area A/A, and the pad area P/A in the stretchable display device 1000" according to still another embodiment of the present disclosure.

Further, as for the first power connecting lines 931 and the second power connecting lines 932, they are straight in the first area 110A, but may be curved in the second area 110B.

Further, the lines disposed in the second area 110B where the first substrate 111 that is a flexible substrate is disposed are made curved and the lines disposed in the first area 110A where the second substrates 112 that are rigid substrates are disposed are made straight in the stretchable display device 1000" according to still another embodiment of the present disclosure. Therefore, it is possible to minimize damage of the lines due to stretching.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A stretchable display panel comprising:
a first substrate including an active area, a non-active area adjacent to the active area, and a pad area extending from a side of the non-active area, the pad area having a first pad area adjacent to the non-active area, a second pad area having a pad disposed therein, and a bending line as a reference defining between the first pad area and the second pad area;
a plurality of second substrates disposed on the first substrate, the plurality of second substrates including a first set disposed in the non-active area, a second set disposed in the active area, and a third set disposed in the pad area; and
connecting lines disposed on the first substrate, the connecting lines being electrically coupled to the pad disposed in the second pad area,
wherein the third set of the plurality of second substrates are disposed in the second pad area of the pad area,
wherein the first pad area is disposed between the non-active area and the second pad area, and
wherein the second pad area is bent towards the bottom surface of the first substrate along the bending line positioned between the first pad area and the second pad area.

2. The stretchable display panel of claim 1,
wherein the first set of the plurality of second substrates disposed in the non-active area and the third set of the plurality of second substrates disposed in the pad area are arranged in a row direction and a column direction that correspond to row direction and column direction of the second set of the plurality of second substrates disposed in the active area.

3. The stretchable display panel of claim 1,
wherein the first substrate is divided into a first area and a second area,
wherein the second substrates are disposed in the first area, wherein the first area including the active area, the non-active area and the pad area, wherein the second area is an area between the second substrates, and wherein the second area adjacent to the region between second substrates disposed in the second pad area has a shape of which the width gradually decreases toward an outermost side of the first substrate.

4. The stretchable display panel of claim 1, further comprising:

a gate driving circuit disposed in the non-active area, wherein the gate driving circuit is configured in a Chip On Film (COF) type.

5. The stretchable display panel of claim 1, wherein the first substrate and the second substrates have different elastic modulus, and a elastic modulus of the second substrates is higher than a elastic modulus of the first substrate.

6. The stretchable display panel of claim 1, wherein the connecting lines are straight.

7. The stretchable display panel of claim 1, wherein the connecting lines are curved.

8. The stretchable display panel of claim 1, wherein a Gate In Panel (GIP) type gate driving circuit is disposed on the plurality of second substrates that are disposed in the non-active area.

9. The display panel according to claim 1, wherein the connecting line comprises:

a base polymer and conductive particles, and the base polymer is disposed in a single layer on the first substrate.

10. A stretchable display panel comprising:

a first substrate including an active area, a non-active area adjacent to the active area, and a pad area extending from a side of the non-active area;

a plurality of second substrates arranged on the first substrate, the plurality of second substrates including a first set disposed in the non-active area and a second set disposed in the active area;

connecting lines disposed on the first substrate, the connecting lines being electrically coupled to a pad disposed in the pad area; and a dummy pixel disposed on at least one of the first set of plurality of second substrates disposed in the non-active area, wherein at least one second substrate having the dummy pixel has a different size from the second substrates without the dummy pixel.

11. The stretchable display panel of claim 10, wherein the at least one second substrate having the dummy pixel of the first set of the plurality of second substrates disposed in the non-active area has a shape of two individual substrates, and the other substrates of the first set of plurality of second substrates without the dummy pixel of the plurality of second substrates disposed in the non-active area have a shape of one individual substrate.

12. The stretchable display panel of claim 11, wherein different power lines are respectively disposed on two islands having the dummy pixel in the non-active area.

13. The stretchable display panel of claim 10, wherein the at least one second substrate having the dummy pixel is larger in size than the second substrates disposed without the dummy pixel.

14. A stretchable display panel comprising:

a first substrate including an active area, a non-active area adjacent to the active area, and a pad area extending from a side of the non-active area, the pad area having a first pad area adjacent to the non-active area and a second pad area having a pad disposed therein;

a plurality of second substrates disposed on the first substrate, the plurality of second substrates including a first set disposed in the non-active area, a second set disposed in the active area, and a third set disposed in the pad area; and connecting lines disposed on the first substrate, the connecting lines being electrically coupled to the pad disposed in the second pad area, wherein the third set of the plurality of second substrates are disposed in the second pad area of the pad area, wherein the first pad area is disposed between the non-active area and the second pad area, and wherein the second pad area is bent towards the bottom surface of the first substrate.

15. The stretchable display panel of claim 14, wherein a position at which the second pad area is bent towards the bottom surface of the first substrate is in the pad area between the first pad area and the second pad area.

16. The stretchable display panel of claim 14, wherein the location of the position at which the second pad area is bent towards the bottom surface of the first substrate is called a bending line as a reference.

\* \* \* \* \*